(12) United States Patent
Sato

(10) Patent No.: US 9,584,161 B2
(45) Date of Patent: Feb. 28, 2017

(54) TRANSMISSION DEVICE

(71) Applicant: NEC CORPORATION, Tokyo (JP)

(72) Inventor: Masaki Sato, Tokyo (JP)

(73) Assignee: NEC CORPORATION, Tokyo (JP)

( * ) Notice: Subject to any disclaimer, the term of this patent is extended or adjusted under 35 U.S.C. 154(b) by 239 days.

(21) Appl. No.: 14/502,451

(22) Filed: Sep. 30, 2014

(65) Prior Publication Data

US 2015/0095743 A1    Apr. 2, 2015

(30) Foreign Application Priority Data

Oct. 1, 2013    (JP) .................................. 2013-206337

(51) Int. Cl.
| | |
|---|---|
| *H03M 13/00* | (2006.01) |
| *H03M 13/35* | (2006.01) |
| *H04J 14/06* | (2006.01) |
| *H04L 1/00* | (2006.01) |
| *H04B 10/00* | (2013.01) |

(52) U.S. Cl.
CPC .......... *H03M 13/353* (2013.01); *H04B 10/00* (2013.01); *H04J 14/06* (2013.01); *H04L 1/00* (2013.01); *H04L 1/0009* (2013.01)

(58) Field of Classification Search
CPC ........ H03M 13/353; H04B 10/00; H04J 14/06
See application file for complete search history.

(56) References Cited

U.S. PATENT DOCUMENTS

| | | | | |
|---|---|---|---|---|
| 7,428,669 B2* | 9/2008 | Cioffi | ....................... | H04B 3/32 714/704 |
| 2006/0280205 A1* | 12/2006 | Cho | ....................... | H04L 1/0009 370/473 |
| 2009/0044079 A1* | 2/2009 | de Lind Van Wijngaarden | ......... | H04L 1/0009 714/774 |
| 2012/0011413 A1* | 1/2012 | Liu | ....................... | H04L 1/0009 714/746 |
| 2013/0259479 A1* | 10/2013 | Mizuguchi | ......... | H04B 10/2507 398/65 |
| 2014/0101512 A1* | 4/2014 | Djordjevic | ......... | H03M 13/1148 714/758 |
| 2014/0133848 A1* | 5/2014 | Koike-Akino | ..... | H04B 10/0799 398/25 |

FOREIGN PATENT DOCUMENTS

JP    2009-89194 A    4/2009

* cited by examiner

*Primary Examiner* — David Ton
(74) *Attorney, Agent, or Firm* — Sughrue Mion, PLLC

(57) ABSTRACT

A transmission device transmitting a polarization-multiplexed optical signal includes: a frame encoder configured to encode an electric signal in accordance with a predetermined frame format; an error correction encoder configured to provide encoded signal data as a result of the encoding by the frame encoder with a predetermined error correction code; and a transmission loss information acquiring part configured to acquire transmission loss information based on a loss that the encoded signal data provided with the error correction code incurs when the encoded signal data is transmitted, from a receiving device as a transmission destination. The error correction encoder adjusts a redundancy of the error correction code given to the encoded signal data, based on the transmission loss information acquired by the transmission loss information acquiring part.

9 Claims, 14 Drawing Sheets

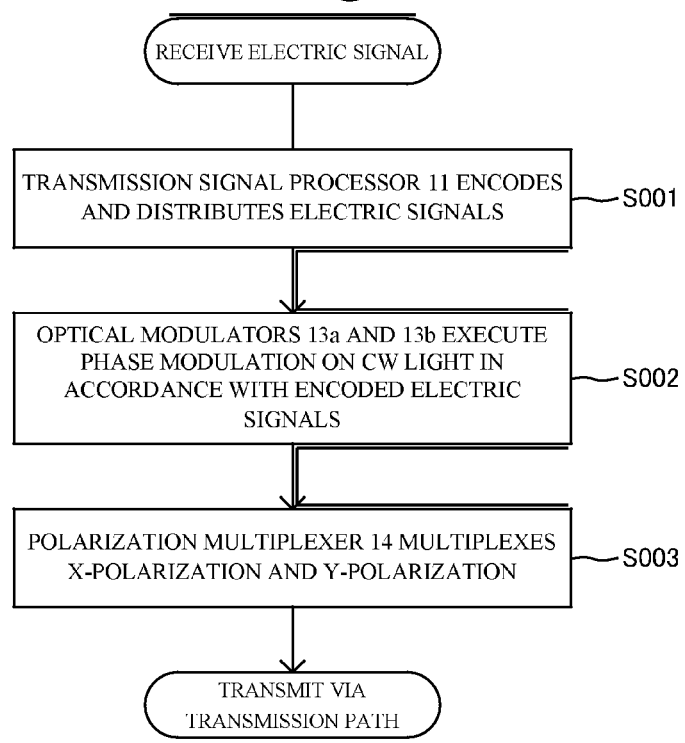

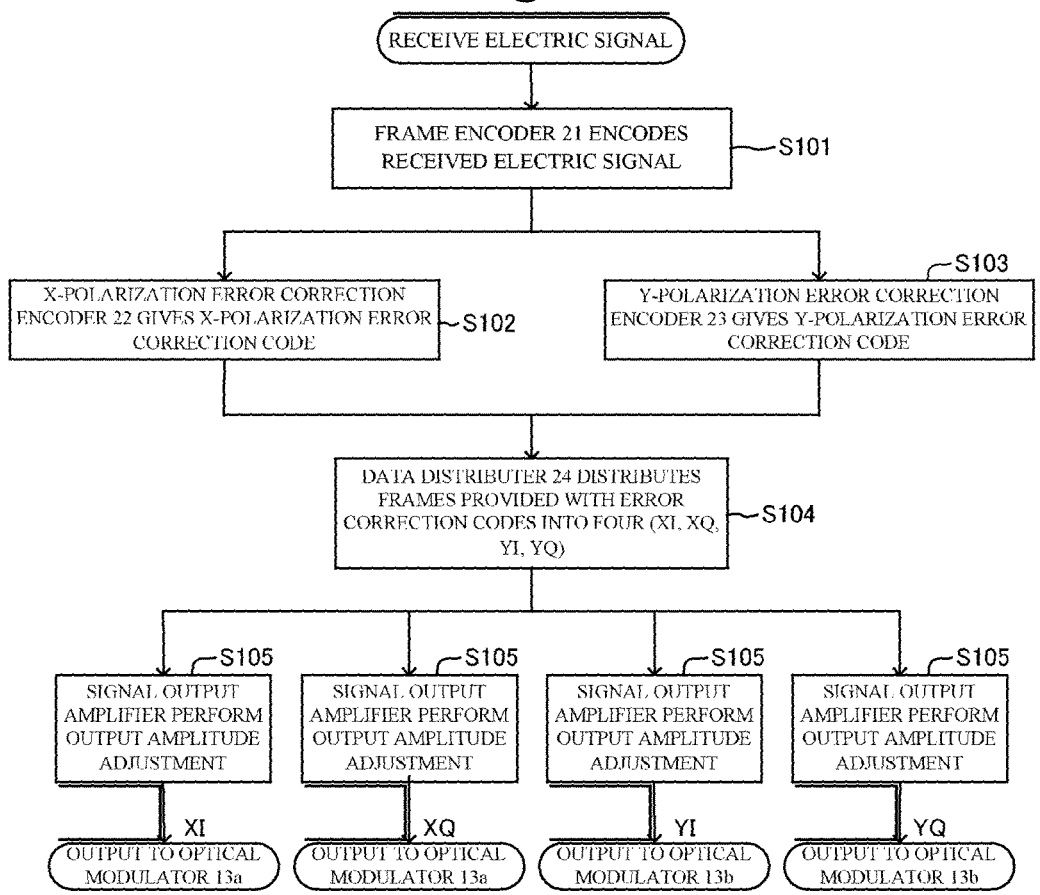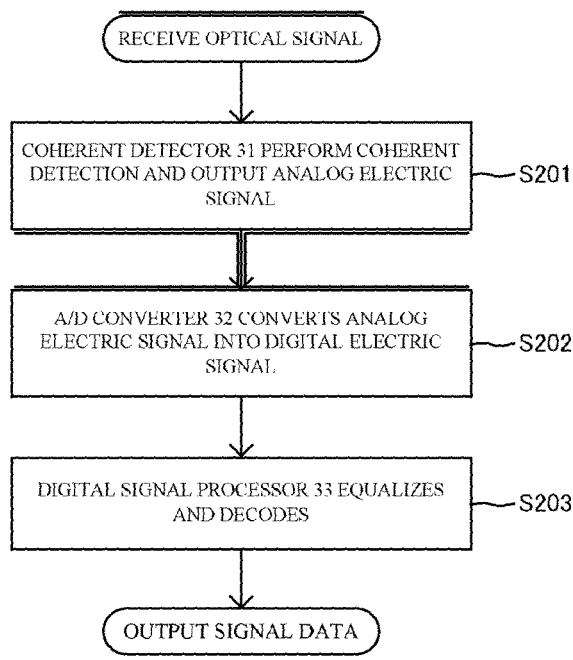

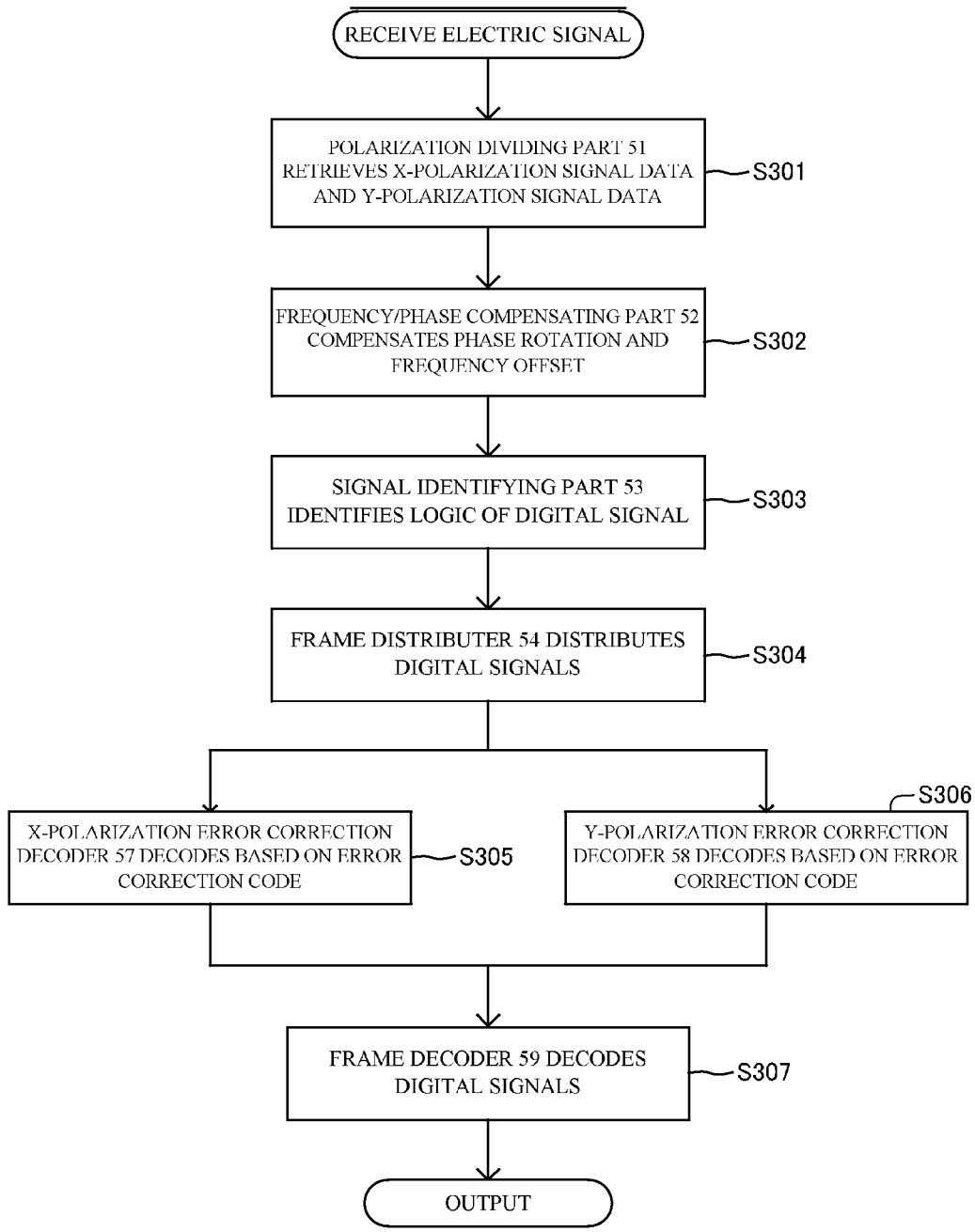

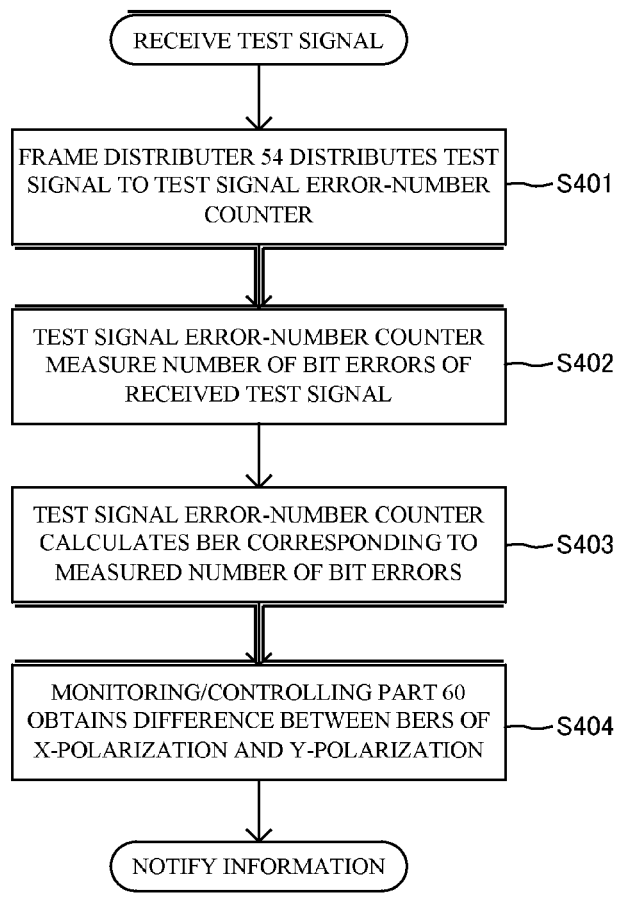

TRANSMISSION DEVICE

INCORPORATION BY REFERENCE

This application is based upon and claims the benefit of priority from Japanese patent application No. 2013-206337, filed on Oct. 1, 2013, the disclosure of which is incorporated herein in its entirety by reference.

TECHNICAL FIELD

The present invention relates to a transmission device, a receiving device, a transmission method, an optical transmission system, and a computer-readable medium storing a program. More specifically, the present invention relates to a transmission device, a receiving device, a transmission method, an optical transmission system, and a computer-readable medium storing a program, each of which uses polarization multiplexing.

BACKGROUND ART

A need for a technique for performing large-volume optical communication at higher speeds has increased as the volume of information transmission has become larger. A technique for performing large-volume optical communication at high speeds is, for example, multi-level modulation, polarization multiplexing, and digital coherent receiving.

When multi-bit information is thus transmitted in one symbol time, characteristics may vary among transmission lanes. In particular, in a case where polarization multiplexing is used, characteristics may vary widely between a transmission lane for an x-polarized wave and a transmission lane for a y-polarized wave because of the PDL (Polarization Dependent Loss) of an optical transmitter, an optical receiver, and a transmission path.

Then, such variation in characteristics among transmission lanes decreases the randomness of received signals, and consequently, deteriorates an error correction performance.

A known optical transmission system which considers variation in characteristics among transmission channels caused by, for example, the PDL of a transmission path and optical devices is one disclosed in Patent Document 1. Patent Document 1 discloses a transmission system which exchanges bits to be transmitted through a channel where information is transmitted by an x-polarized wave and bits to be transmitted through a channel where information is transmitted by a y-polarized wave at a predetermined ratio and thereby assigns transmission data to the respective transmission channels so that variation in characteristics is averaged in all of the transmission channels.

Patent Document 1: Japanese Unexamined Patent Application Publication No. JP-A 2009-089194

However, the technique disclosed in Patent Document 1 cannot sufficiently deal with deterioration of the performance of an error correction code because there is no change in the performance of an error correction code. Thus, there is a problem that it is impossible to sufficiently deal with deterioration of the performance of an error correction code.

SUMMARY

Accordingly, an object of the present invention is to provide a transmission device which is capable of solving the abovementioned problem that it is impossible to sufficiently deal with deterioration of the performance of an error correction code.

In order to achieve the object, a transmission device as an aspect of the present invention is a transmission device transmitting a polarization-multiplexed optical signal, the transmission device including:

a frame encoder configured to encode an electric signal in accordance with a predetermined frame format;

an error correction encoder configured to provide encoded signal data as a result of the encoding by the frame encoder with a predetermined error correction code; and a transmission loss information acquiring part configured to acquire transmission loss information based on a loss that the encoded signal data provided with the error correction code incurs when the encoded signal data is transmitted, from a receiving device as a transmission destination, wherein the error correction encoder is configured to adjust a redundancy of the error correction code given to the encoded signal data, based on the transmission loss information acquired by the transmission loss information acquiring part.

Further, a receiving device as another aspect of the present invention includes:

an optical signal receiver configured to receive a polarization-multiplexed optical signal obtained by multiplexing a first-direction polarized wave and a second-direction polarized wave, each of which is obtained by modulating signal data composed of encoded signal data and an error correction signal;

a transmission loss information detector configured to detect a loss that the encoded signal data incurs while being transmitted, and acquire transmission loss information based on the loss that the encoded signal data incurs while being transmitted;

a transmission loss information notifying part configured to notify the transmission loss information acquired by the transmission loss information detector, to a transmission device;

a first-direction error correction decoder configured to decode encoded signal data transmitted by the first-direction polarized wave, based on the error correction code given to the encoded signal data transmitted by the first-direction polarized wave; and a second-direction error correction decoder configured to decode encoded signal data transmitted by the second-direction polarized wave, based on the error correction code given to the encoded signal data transmitted by the second-direction polarized wave.

Further, a transmission method as another aspect of the present invention is a transmission method of encoding a received electric signal and, by a polarization-multiplexed optical signal, transmitting signal data obtained by providing encoded signal data as a result of the encoding with a predetermined error correction code, the transmission method including:

acquiring transmission loss information based on a loss that the encoded signal data acquires while being transmitted; and adjusting a redundancy of the error correction code given to the encoded signal data, based on the transmission loss information.

Further, an optical transmission system as another aspect of the present invention is an optical transmission system including a transmission device including:

a frame encoder configured to encode an electric signal in accordance with a predetermined frame format;

an error correction encoder configured to provide encoded signal data as a result of the encoding by the frame encoder with a predetermined error correction code; and a transmission loss information acquiring part configured to acquire transmission loss information based on a loss that the encoded signal data provided with the error correction code incurs when the encoded signal data is transmitted, from a receiving device as a transmission destination, the error correction encoder being configured to adjust a redundancy of the error correction code given to the encoded signal data, based on the transmission loss information acquired by the transmission loss information acquiring part, the optical transmission system including a receiving device including:

an optical signal receiver configured to receive the encoded signal data provided with the error correction code, the encoded signal data being transmitted by the transmission device;

a transmission loss information detector configured to detect a loss that the encoded signal data incurs while being transmitted, and acquire transmission loss information based on the loss that the encoded signal data incurs while being transmitted;

a transmission loss information notifying part configured to notify the transmission loss information acquired by the transmission loss information acquiring part, to the transmission device;

a first-direction error correction decoder configured to decode encoded signal data transmitted by a first-direction polarized wave, based on the error correction code given to the encoded signal data transmitted by the first-direction polarized wave; and a second-direction error correction decoder configured to decode encoded signal data transmitted by a second-direction polarized wave, based on the error correct code given to the encoded signal data transmitted by the second-direction polarized wave.

Further, a non-transitory computer-readable medium storing a program as another aspect of the present invention is a non-transitory computer-readable medium storing a program including instructions for causing a transmission device transmitting a polarization-multiplexed optical signal to realize:

a frame encoding unit configured to encode an electric signal in accordance with a predetermined frame format;

an error correction encoding unit configured to provide encoded signal data as a result of the encoding by the frame encoding unit with a predetermined error correction code; and a transmission loss information acquiring unit configured to acquire transmission loss information based on a loss that the encoded signal data provided with the error correction code incurs when the encoded signal data is transmitted, from a receiving device as a transmission destination, the error correction encoding unit functioning to adjust a redundancy of the error correction code given to the encoded signal data, based on the transmission loss information acquired by the transmission loss information acquiring unit.

With the configurations as described above, the present invention enables reduction of deterioration of the performance of an error correction code.

BRIEF DESCRIPTION OF DRAWINGS

FIG. 7 is a flowchart showing the operation of the transmission device in the first exemplary embodiment;

FIG. 8 is a flowchart showing the operation of the transmission signal processor in the first exemplary embodiment;

FIG. 9 is a flowchart showing the operation of the receiving device in the first exemplary embodiment;

FIG. 10 is a flowchart showing the operation of the digital signal processor in the first exemplary embodiment;

FIG. 11 is a flowchart showing the flow of calculation of redundancy-changing bit-number information in the first exemplary embodiment;

EXEMPLARY EMBODIMENT

<First Exemplary Embodiment>

Figure 1:
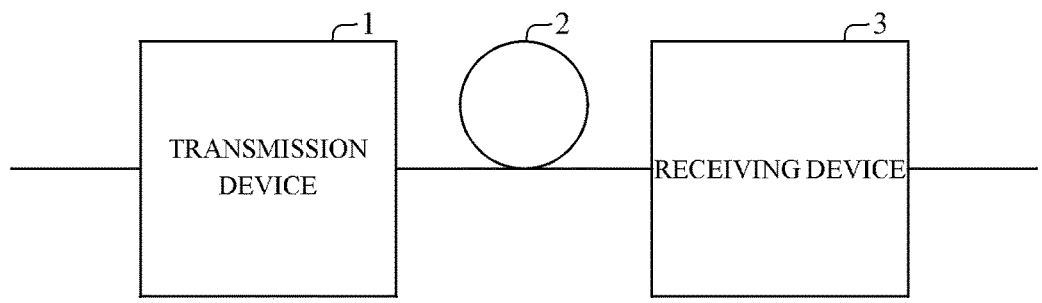
FIG. 1 is a block diagram showing the overview of the configuration of an optical transmission system in a first exemplary embodiment of the present invention.
Figure 2:
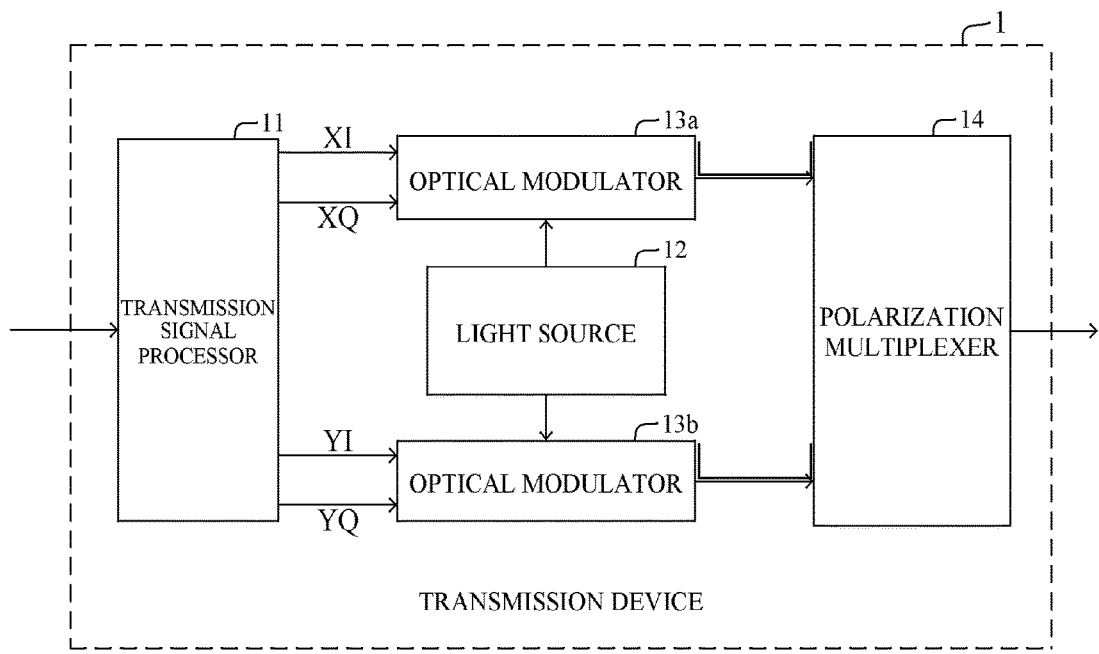
FIG. 2 is a block diagram showing the configuration of a transmission device shown in FIG. 1.
Figure 3:
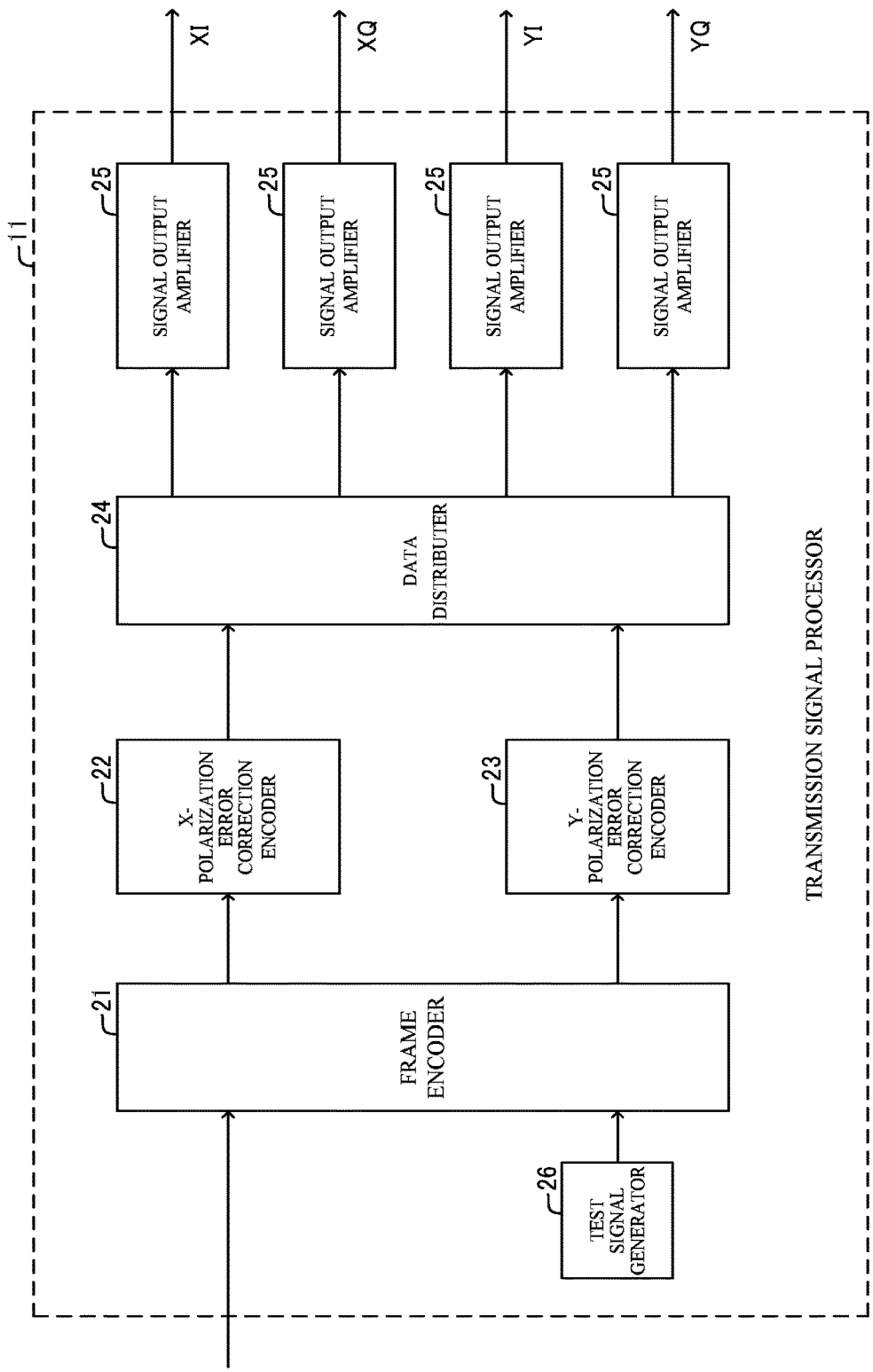
FIG. 3 is a block diagram showing the configuration of a transmission signal processor shown in FIG. 2.
Figure 4:
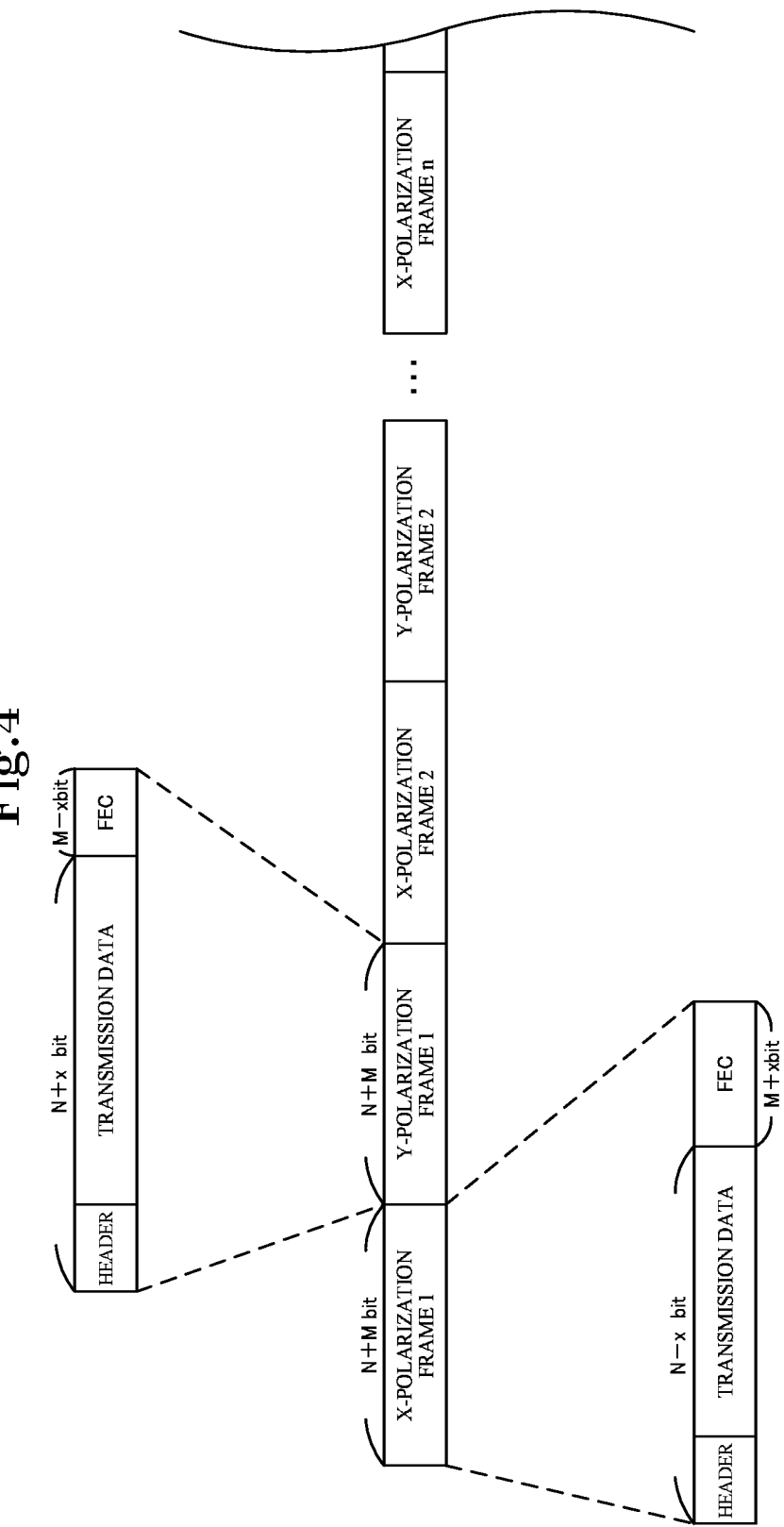
FIG. 4 is a diagram showing the configuration of a frame provided with an error correction code in the first exemplary embodiment.
Figure 5:
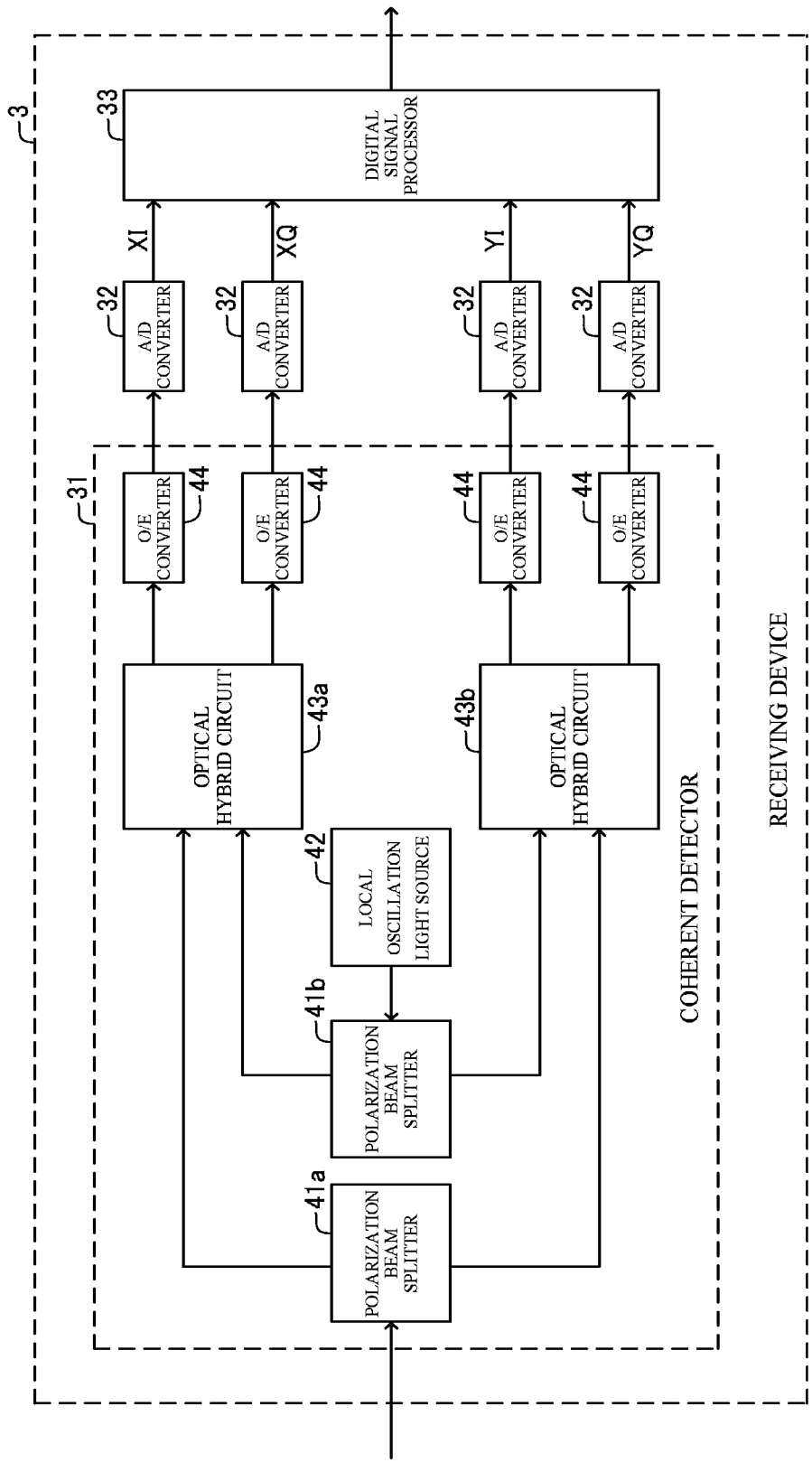
FIG. 5 is a block diagram showing the configuration of a receiving device shown in FIG. 1.
Figure 6:
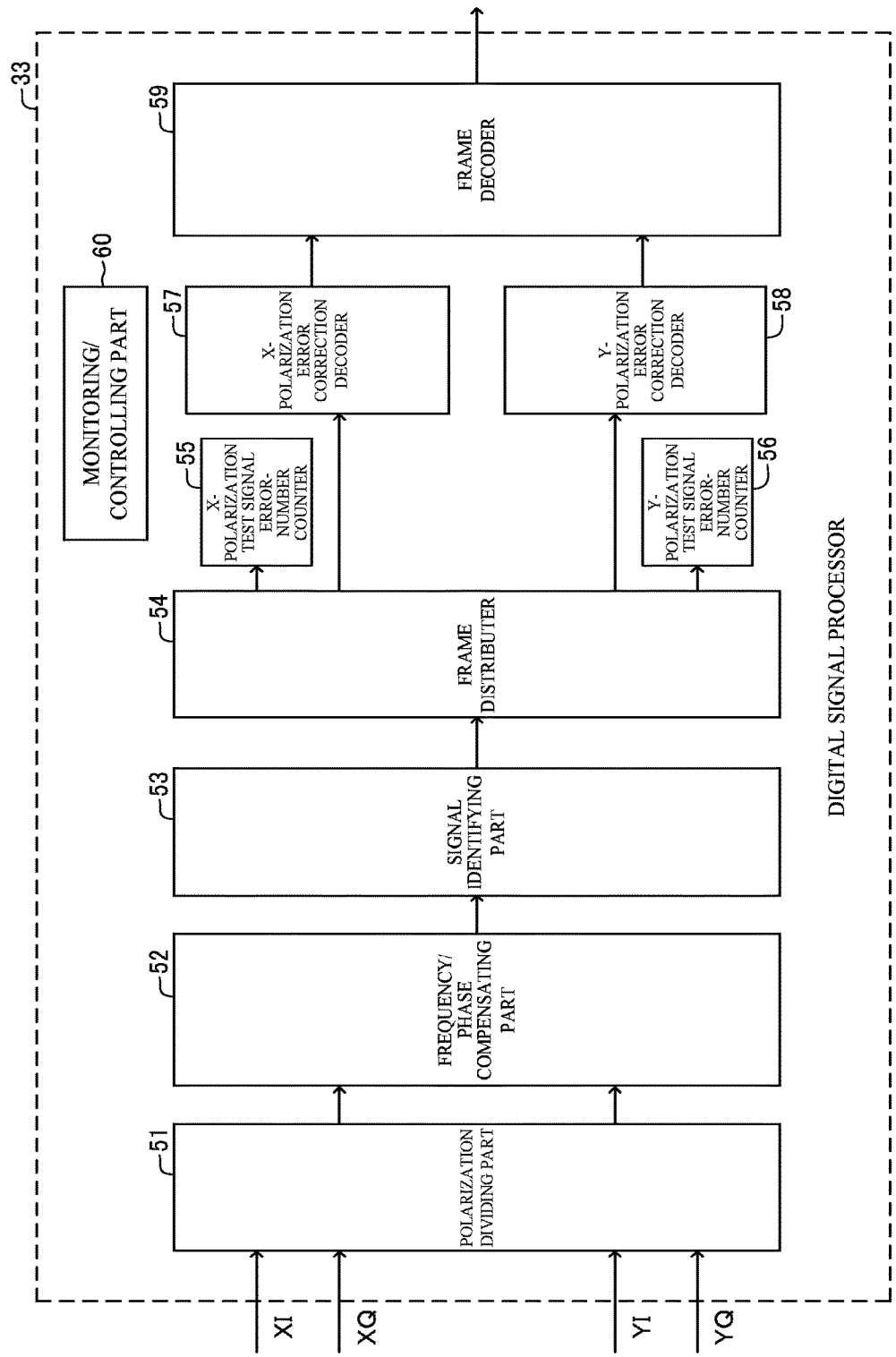
FIG. 6 is a block diagram showing the configuration of a digital signal processor shown in FIG. 5.

A first exemplary embodiment of the present invention will be described referring to FIGS. 1 to 11. FIG. 1 is a block diagram showing the overview of the configuration of an optical transmission system. FIG. 2 is a block diagram showing the configuration of a transmission device 1. FIG. 3 is a block diagram showing the configuration of a transmission signal processor 11 included by the transmission device 1. FIG. 4 is a diagram showing the configuration of a frame provided with a forward error correction code in this exemplary embodiment. FIG. 5 is a block diagram showing the configuration of a receiving device 3. FIG. 6 is a block diagram showing the configuration of a digital signal processor 33 included by the receiving device 3. FIG. 7 is a flowchart showing the operation of the transmission device 1. FIG. 8 is a flowchart showing the operation of the transmission signal processor 11. FIG. 9 is a flowchart showing the operation of the receiving device 3. FIG. 10 is a flowchart showing the operating of the digital signal processor 33. FIG. 11 is a flowchart showing the flow of calculation of redundancy-changing bit-number information.

In the first exemplary embodiment of the present invention, a polarization-multiplexing optical signal transmission system that transmits an optical signal will be described.

As shown in FIG. 1, the optical signal transmission system in the first exemplary embodiment includes the transmission device 1 and the receiving device 3. The transmission device 1 and the receiving device 3 are connected via an optical transmission path 2. Connecting the transmission device 1 and the receiving device 3 via the optical transmission path 2 enables the optical signal transmission system to transmit a polarization-multiplexed optical signal from the transmission device 1 to the receiving device 3. In this exemplary embodiment, an optical fiber is used as the optical transmission path 2. The present invention can be embodied regardless of the type of an optical fiber.

(Configuration)

First, the configuration of the transmission device 1 will be described. The transmission device 1 is a device which converts an electric signal inputted from outside into an optical signal and transmits the optical signal to the optical transmission path 2. As shown in FIG. 2, the transmission device 1 in this exemplary embodiment includes the transmission signal processor 11, a light source 12, optical modulators 13a and 13b, and a polarization multiplexer 14.

The transmission signal processor 11 is connected with the respective optical modulators 13a and 13b so as to be capable of transmitting electric signals. To be specific, the transmission signal processor 11 and the optical modulator 13a are connected by two transmission lanes capable of transmitting electric signals, and the transmission signal processor 11 and the optical modulator 13b are also connected by two transmission lanes capable of transmitting electric signals. Moreover, the light source 12 is connected with the respective optical modulators 13a and 13b so as to be capable of transmitting optical signals, and the respective optical modulators 13a and 13b are also connected with the polarization multiplexer 14 so as to be capable of transmitting optical signals. The polarization multiplexer 14 is connected with the optical fiber of the optical transmission path 2. The respective components of the transmission device 1 will be described below.

The transmission signal processor 11 is a part which encodes an electric signal (signal data) inputted therein to a frame including an error correction code. The transmission signal processor 11 is also a part which adjusts the output amplitude of the encoded electric signal. The signal data encoded in the transmission signal processor 11 is distributed to four lanes and subjected to output amplitude adjustment, and then outputted as analog electric signals to the optical modulators 13a and 13b. The detailed configuration of the transmission signal processor 11 will be described later.

The light source 12 is a part which continuously emits a constant-power CW (Continuous Wave) laser light. The light source 12 includes a light-emitting element. The CW laser light emitted by the light source 12 is transmitted to the optical modulators 13a and 13b. To be specific, the light source 12 is formed by a semiconductor laser, or the like.

Each of the optical modulators 13a and 13b is a part which executes phase modulation of the same-direction polarization on the CW laser light inputted from the light source 12, in accordance with the analog electric signals of the two lanes inputted from the transmission signal processor 11. Then, each of the optical modulators 13a and 13b transmits the phase-modulated optical signal to the polarization multiplexer 14. As each of the optical modulators 13a and 13b, for example, an optical modulator using lithium niobate (LiNbO3) is used.

The polarization multiplexer 14 is a part which performs polarization multiplexing of the phase-modulated optical signals inputted from the respective optical modulators 13a and 13b and transmits to the optical transmission path 2. To be specific, the polarization multiplexer 14 makes the phase-modulated optical signal transmitted from the optical modulator 13a an x-polarized (first-direction-polarized) phase-modulated signal. Meanwhile, the polarization multiplexer 14 shifts the polarization angle of the phase-modulated optical signal transmitted from the optical modulator 13b by 90 degrees to make the optical signal a y-polarized (second-direction-polarized) phase-modulated signal. The polarization multiplexer 14 then multiplexes (performs polarization-multiplexing of) the x-polarized phase-modulated signal and the y-polarized phase-modulated signal. After that, the polarization multiplexer 14 outputs the polarization-multiplexed multi-level phase-modulated optical signal to the optical transmission path 2. As the polarization multiplexer, a polarization combiner is used, for example.

The configuration of the transmission device 1 has been described above. With such a configuration, the transmission device 1 can output a polarization-multiplexed phase-modulated optical signal corresponding to an electric signal inputted from outside. Hereinafter, the detailed configuration of the abovementioned transmission signal processor 11 will be described referring to FIG. 3.

As shown in FIG. 3, the transmission signal processor 11 in this exemplary embodiment includes a frame encoder 21, an x-polarization error correction encoder 22 (an error correction encoder), a y-polarization error correction encoder 23 (the error correction encoder), a data distributer 24, a signal output amplifier 25, and a test signal generator 26. Moreover, the transmission signal processor 11 includes a redundancy-changing bit-number information acquiring means (a transmission loss information acquiring part), which is not shown in the drawings. The redundancy-changing bit-number information acquiring means is a means for acquiring redundancy-changing bit-number information (transmission loss information, polarization dependent loss information) from the receiving device 3. In this exemplary embodiment, the frame encoder 21 includes the redundancy-changing bit-number information acquiring means. A method for calculating redundancy-changing bit-number information will be described later. Moreover, in this exemplary embodiment, it is assumed that redundancy-changing bit-number information is acquired as transmission loss information. However, according to the present invention, for example, it is possible to configure in a manner that the receiving device 3 transmits the number of bit errors to the transmission device 1 and the transmission signal processor 11 thereby calculates redundancy-changing bit-number information.

Further, as shown in FIG. 3, the respective components are connected so as to be capable of communicating electric signals: the frame encoder 21 and the x-polarization error correction encoder 22; the frame encoder 21 and the y-polarization error correction encoder 23; the x-polarization error correction encoder 22 and the data distributer 24; the y-polarization error correction encoder 23 and the data distributer 24; the data distributer 24 and the signal output amplifier 25; and the test signal generator 26 and the frame encoder 21. The respective components of the transmission signal processor 11 will be described below.

First, the frame encoder 21 will be described. The frame encoder 21 is a part which encodes an electric signal (signal data) inputted from outside in accordance with a required frame format. To be specific, as shown in FIG. 4, upon receiving signal data inputted from outside, the frame encoder 21 provides transmission data corresponding to the signal data with a header composed of control information and the like. Thus, the frame encoder 21 alternately generates a frame for x-polarization (an x-polarization frame) and a frame for y-polarization frame (a y-polarization frame). Then, the frame encoder 21 transmits the signal data for x-polarization subjected to bit multiplexing per frame, to the x-polarization error correction encoder 22. Meanwhile, the frame encoder 21 transmits the signal data for y-polarization subjected to bit multiplexing per frame, to the y-polarization error correction encoder 23.

Further, as described above, the frame encoder 21 in this exemplary embodiment includes the redundancy-changing bit-number information acquiring means. When generating an x-polarization frame and a y-polarization frame, the frame encoder 21 writes redundancy-changing bit-number information acquired by the redundancy-changing bit-number information acquiring means into the header portion of each of the frames. Because the frame encoder 21 writes redundancy-changing bit-number information into the header portion of each frame, it is possible to execute various processes to be described later.

Further, when generating an x-polarization frame and a y-polarization frame, the frame encoder 21 adjusts the number of bits of each of transmission data configuring the x-polarization frame and the y-polarization frame in accordance with the redundancy-changing bit-number information acquired by the redundancy-changing bit-number information acquiring means. As described later, the redundancy (the number of bits) of an x-polarization error correction code given by the x-polarization error correction encoder 22 and the redundancy of a y-polarization error correction code given by the y-polarization error correction encoder 23 are each adjusted based on the redundancy-changing bit-number information. The frame encoder 21 adjusts the number of bits of each transmission data so that the total number of bits of the whole frame becomes constant even if the x-polarization error correction encoder 22 and the y-polarization error correction encoder 23 give error correction codes of different redundancies.

To be specific, for example, as shown in FIG. 4, in a case where the redundancy of an error correction code given by the x-polarization error correction encoder 22 to be described later is M+x bits (i.e., redundancy-changing bit-number information for x-polarization is +x), the frame encoder 21 generates a frame for x-polarization so that the total number of bits of the header and the transmission data becomes N−x bits. Meanwhile, in a case where the redundancy of an error correction code given by the y-polarization error correction encoder 23 to be described later is M−x bits (i.e., redundancy-changing bit-number information for y-polarization is −x), the frame encoder 21 generates a frame for y-polarization so that the total number of bits of the header and the transmission data becomes N+x bits. By thus generating a frame for x-polarization and a frame for y-polarization, the frame encoder 21 can generate a frame for x-polarization and a frame for y-polarization such that the total bit lengths of the whole frames become all N+M bits as a result that the respective error correction encoders described later give error correction codes.

The frame encoder 21 adjusts the number of bits by changing the number of bits of transmission data configuring a frame while not changing the number of bits of a header portion of the frame. In other words, the frame encoder 21 has a function of adjusting the number of bits of transmission data in accordance with the redundancy of an error correction code (or in accordance with redundancy-changing bit-number information).

Further, the frame encoder 21 has a function of switching between input of an electric signal from outside as described above and input of a test signal from the test signal generator 26 to be described later. In this exemplary embodiment, when the frame encoder 21 switches to input of a test signal from the test signal generator 26, it becomes possible to calculate redundancy-changing bit-number information to be described later.

Next, the x-polarization error correction encoder 22 and the y-polarization error correction encoder 23 will be described. Each of the x-polarization error correction encoder 22 and the y-polarization error correction encoder 23 is a part which provides a frame received thereby with an error correction code having a length designated by redundancy-changing bit-number information. After providing the received frame with the error correction code, each of the x-polarization error correction encoder 22 and the y-polarization error correction encoder 23 transmits the frame provided with the error correction code to the data distributer 24.

To be specific, the x-polarization error correction encoder 22 and the y-polarization error correction encoder 23 read redundancy-changing bit-number information transmitted by the receiving device 3 described later, from the header portions of the respective frames. As described later, in redundancy-changing bit-number information, the number of bits "x" that changes the redundancy of an error correction code, a direction of the change, and information whether the information is for x-polarization or for y-polarization are described. As shown in FIG. 4, based on the redundancy-changing bit-number information read from the header portion of each frame, the x-polarization error correction encoder 22 and the y-polarization error correction encoder 23 each provide signal data with an error correction code having a designated length (+x, −x). Consequently, each of the x-polarization error correction encoder 22 and the y-polarization error correction encoder 23 can provide each frame with an error correction code which is +x bits longer or −x bits shorter than M bits of predetermined redundancy. Because the x-polarization error correction encoder 22 and the y-polarization error correction encoder 23 each add error correction codes having different numbers of bits designated by redundancy-changing bit-number information, the total bit length of a frame for x-polarization and the total bit length of a frame for y-polarization become equal. The x-polarization error correction encoder 22 and the y-polarization error correction encoder 23 may be configured to directly receive redundancy-changing bit-number information from the receiving device 3.

Next, the data distributer 24 will be described. The data distributer 24 in this exemplary embodiment is a part which distributes frames provided with error correction codes and inputted by the x-polarization error correction encoder 22 and the y-polarization error correction encoder 23 to four and outputs the frames to the signal output amplifier 25. Although the data distributer 24 distributes frames to four in this exemplary embodiment, the data distributer 24 may be configured to distribute to three or less or five or more.

To be specific, the data distributer 24 multiplexes, per frame, frames provided with error correction codes and inputted by the x-polarization error correction encoder 22 and the y-polarization error correction encoder 23, and thereafter, distributes the frames to four transmission lanes per bit. The distribution and the output are controlled so that frames provided with error correction codes for x-polarization by the x-polarization error correction encoder 22 are distributed to the transmission lanes for transmission to the optical modulator 13a through the signal output amplifiers 25. Likewise, the distribution and the output are controlled so that frames provided with error correction codes for y-polarization by the y-polarization error correction encoder 23 are distributed to the transmission lanes for transmission to the optical modulator 13b through the signal output amplifiers 25. The data distributer 24 thus controls by, for example, reading redundancy-changing bit-number information written in the header portion of each frame.

Next, the signal output amplifiers 25 will be described. Each of the signal output amplifiers 25 is a part which performs output amplitude adjustment corresponding to the respective optical modulators 13a and 13b. After performing proper output amplitude adjustment, the signal output amplifiers 25 output analog electric signals to the optical modulators 13a and 13b.

Next, the test signal generator 26 will be described. The test signal generator 26 is a part which generates a test signal composed of a pseudorandom sequence. A test signal is a signal which is used at the time of calculating redundancy-changing bit-number information to be described later. As mentioned above, the frame encoder 21 is configured to be capable of controlling whether to receive an electric signal from outside or receive a test signal from the test signal generator 26. Therefore, the test signal generator 26 transmits a test signal to the frame encoder 21 in accordance with an instruction from the frame encoder 21.

The configuration of the transmission signal processor 11 has been described above. By thus configuring the transmission signal processor 11, the transmission signal processor 11 can encode inputted electric signals (signal data) to frames including error correction codes and output the encoded signal data as analog electric signals to the optical modulators 13a and 13b.

Next, the configuration of the receiving device 3 shown in FIG. 1 will be described. The receiving device 3 is a digital coherent receiving device which receives a polarization-multiplexed phase-modulated optical signal transmitted from the transmission device 1 via the optical transmission path 2. As shown in FIG. 5, the receiving device 3 in this exemplary embodiment includes a coherent detector 31 (an optical signal receiver), an A/D (Analog/Digital) converter 32, and a digital signal processor 33 (part thereof has a roll of a transmission loss information detector and a roll of a transmission loss information notifying part). Moreover, the coherent detector 31 includes polarization beam splitters 41a and 41b, a local oscillation light source 42, optical hybrid circuits 43a and 43b, and an O/E (Optical/Electrical) converter 44.

As shown in FIG. 5, the coherent detector 31 is connected with the respective A/D converters 32 so as to be capable of transmitting electric signals, and the respective A/D converters are connected with the digital signal processor so as to be capable of transmitting electric signals. Moreover, the polarization beam splitter 41a is connected with the optical hybrid circuits 43a and 43b by transmission paths capable of transmitting optical signal, the local oscillation light source 42 is connected with the polarization beam splitter 41b by a transmission path capable of transmitting optical signal, the polarization beam splitter 41b is connected with the optical hybrid circuits 43a and 43b by transmission paths capable of transmitting optical signal, and the optical hybrid circuits 43a and 43b are connected with the O/E converters by transmission paths capable of transmitting optical signal. Moreover, the coherent detector 31 is connected with the optical path 2, and the digital signal processor 33 is configured to be capable of transmitting electric signals to the outside.

Below, the respective components of the receiving device 3 will be described.

The coherent detector 31 is a part which mixes a polarization-multiplexed optical signal received by the receiving device 3 and a local oscillation light emitted by the local oscillation light source 42, performs coherent detection, and outputs an electric signal corresponding to the polarization-multiplexed optical signal. As mentioned above, the coherent detector 31 includes the polarization beam splitters 41a and 41b, the local oscillation light source 42, the optical hybrid circuits 43a and 43b, and the O/E converter 44. Below, the detailed configuration of the coherent detector 31 will be described.

The polarization beam splitter 41a is an optical device which splits a polarization-multiplexed phase-modulated optical signal into an x-direction polarized wave and a y-direction polarized wave. To be specific, the polarization beam splitter 41a first receives a polarization-multiplexed phase-modulated optical signal transmitted from the transmission device 1 via the optical transmission path 2. Subsequently, the polarization beam splitter 41a splits the received optical signal into an x-direction polarized wave and a y-direction polarized wave. Then, the polarization beam splitter 41a outputs the split x-direction polarized wave to the optical hybrid circuit 43a. Likewise, the polarization beam splitter 41a outputs the split y-direction polarized wave to the optical hybrid circuit 43b.

The polarization beam splitter 41b has the same configuration as the polarization beam splitter 41a. The polarization beam splitter 41b is an optical device which splits a local oscillation light emitted by the local oscillation light source into an x-direction polarized wave and a y-direction polarized wave. That is, the polarization beam splitter 41b receives a local oscillation light inputted from the local oscillation light source 42, and splits the light into an x-direction polarized wave and a y-direction polarized wave. Then, the polarization beam splitter 41b outputs the split x-direction polarized wave to the optical hybrid circuit 43a. Likewise, the polarization beam splitter 41b outputs the split y-direction polarized wave to the optical hybrid circuit 43b.

The local oscillation light source 42 is a light source which emits a constant-power local oscillation light, and includes a light-emitting element. As mentioned above, a local oscillation light emitted by the local oscillation light source 42 is inputted into the polarization beam splitter 41b.

Each of the optical hybrid circuits 43a and 43b is an optical component which mixes a phase-modulated optical signal (a light received from the transmission device 1) and a local oscillation light inputted from the local oscillation light source 42 in two more different phases and then outputs. In this exemplary embodiment, the optical hybrid circuits 43a and 43b mix the inputted optical signals and the local oscillation lights, respectively, and output as two pairs of lights whose phases are different from each other by 90 degrees (in-phase I and quadrature-phase Q) to the respective O/E converters 44. As mentioned above, an x-direction polarized wave is inputted into the optical hybrid circuit 43a, and a y-direction polarized wave is inputted into the optical hybrid circuit 43b.

The O/E converters 44 are optical devices which perform photoelectric conversion of the in-phase optical signals and the quadrature-phase optical signals inputted from the optical hybrid circuits 43a and 43b. The O/E converters 44 each include a light-receiving element. The O/E converters 44 each convert an optical signal into an electric signal and perform proper output amplitude adjustment, and then output the analog electric signal with the output amplitude adjusted.

The configuration of the coherent detector 31 has been described above. With such a configuration, the coherent detector 31 can output an analog electric signal corresponding to an inputted optical signal.

Then, as shown in FIG. 5, analog electric signals outputted from the coherent detector 31 are transmitted to the A/D converters 32.

Each of the A/D converters 32 is a part which samples inputted analog electric signals at proper time intervals and thereby converts the signals into quantized digital signals. Then, the A/D converter 32 outputs the digital signals obtained by conversion to the digital signal processor 33.

The digital signal processor 33 is a part which performs equalization of digital signals inputted thereinto and then decodes the signals based on an error correction code. The digital signal processor 33 demodulates from signal data modulated and transmitted by the transmission device 1, and outputs the data to the outside.

For example, because a phase-modulated optical signal transmitted from the transmission device 1 is transmitted through the optical transmission path 2, phase rotation may occur. Moreover, in a case where a general light source for wavelength multiplexing is used, optical frequency offset may occur between the light source 12 and the local oscillation light source 42. Therefore, the digital signal processor 33 compensates such phase rotation and frequency offset. The digital signal processor 33 executes decoding after compensating the phase rotation and frequency offset.

The detailed configuration of the digital signal processor 33 will be described referring to FIG. 6. As shown in FIG. 6, the digital signal processor 33 in this exemplary embodiment includes a polarization dividing part 51, a frequency/phase compensating part 52, a signal identifying part 53, a frame distributer 54, an x-polarization test signal error-number counter 55 (the transmission loss information detector), a y-polarization test signal error-number counter 56 (the transmission loss information detector), an x-polarization error correction decoder 57, a y-polarization error correction decoder 58, a frame decoder 59, and a monitoring/controlling part 60 (a transmission loss information transmitter).

Further, as shown in FIG. 6, the polarization dividing part 51 is connected with the frequency/phase compensating part 52 so as to be capable of transmitting electric signals, the frequency/phase compensating part 52 is connected with the signal identifying part 53 so as to be capable of transmitting electric signals, the signal identifying part 53 is connected with the frame distributer 54 so as to be capable of transmitting electric signals, the frame distributer 54 is connected with the x-polarization test signal error-number counter 55 and the y-polarization test signal error-number counter 56 so as to be capable of transmitting electric signals, the frame distributer 54 is connected with the x-polarization error correction decoder 57 and the y-polarization error correction decoder 58 so as to be capable of transmitting electric signals, and the x-polarization error correction error correction decoder 57 and the y-polarization error correction decoder 58 are connected with the frame decoder 59 so as to be capable of transmitting electric signals. Likewise, the monitoring/controlling part 60 is connected with the x-polarization test signal error-number counter 55 and the y-polarization test signal error-number counter 56 so as to be capable of electric signals through transmission lanes, which are not shown in the drawings. Below, the respective components of the digital signal processor 33 will be described.

First, the polarization dividing part 51 will be described. The polarization dividing part 51 is a part which performs polarization division of digital signals inputted from the A/D converts 32 and retrieves x-polarization signal data and y-polarization signal data. Polarization division of digital signals is performed by applying an adaptive equalization filter such as a CMA (Constant Modulus Algorithm). This is necessary because crosstalk occurs while a polarization-multiplexed optical signal is transmitted through the optical transmission path 2 and consequently an x-polarized wave and a y-polarized wave may be each received containing a signal that is multiplexed in the other direction. That is to say, because digital signals before processed by the digital signal processor 33 are in an incomplete polarization-division state, the polarization dividing part 51 executes an equalization process of the digital signals in such a state. The x-polarization signal data and the y-polarization signal data obtained by the division by the polarization dividing part 51 are transmitted to the frequency/phase compensating part 52.

CMA is an algorithm that accurately divides without mixing polarization-multiplexed signals. For example, CMA brings the absolute value of the amplitude of an output signal close to a designated reference value by regulation of a filter coefficient. Moreover, CMA does not need transmitted information, and therefore, is called blind equalization.

Next, the frequency/phase compensating part 52 will be described. The frequency/phase compensating part 52 is a part which compensates phase rotation of a polarized wave and frequency offset resulting from the frequency of the light source 12 of the transmission device 1 and the frequency of the local oscillation light source 42 of the receiving device 3. The frequency/phase compensating part 52 transmits the compensated signal data to the signal identifying part 53. Because phase rotation and a difference in frequency accompany temporarily high-speed change, an adaptive equalization filter is applied in general.

Next, the signal identifying part 53 will be described. The signal identifying part 53 is a part which identifies whether a digital signal (signal data) inputted from the frequency/phase compensating part 52 is signal data showing logic 0 or signal data showing logic 1. This identification is performed by using information embedded into a frame format in the frame encoder 21 of the transmission device 1. The signal identifying part 53 transmits the identified data signal to the frame distributer 54.

Next, the frame distributer 54 will be described. The frame distributer 54 is a part which separates digital signals inputted from the signal identifying part 53 into x-polarization frames and y-polarization frames. This is performed by using information (e.g., redundancy-changing bit-number information of header portions) embedded into frame formats in the frame encoder 21 of the transmission device 1. After separating the digital signals into x-polarization frames and y-polarization frames, the frame distributer 54 transmits the x-polarization frames to the x-polarization error correction decoder 57, and transmits the y-polarization frames to the y-polarization error correction encoder 58.

Further, the frame distributer 54 determines test signals transmitted from the test signal generator 26 of the transmission device 1. Moreover, the frame distributer 54 separates the determined test signals into those for x-polarization and those for y-polarization. Then, the frame distributer 54 transmits the test signals for x-polarization to the x-polarization test signal error-number counter, and transmits the test signals for y-polarization to the y-polarization test signal error-number counter. Because the frame distributer 54 thus distributes the test signals, it is possible to calculate redundancy-changing bit-number information as described later.

Next, the x-polarization error correction decoder 57 and the y-polarization error correction decoder 58 will be described. The x-polarization error correction decoder 57 and the y-polarization error correction decoder 58 are parts which decode the x-polarization frames and the y-polarization frames distributed from the frame distributer 54, based on the error correction codes in the respective frames. As mentioned above, there is a difference in redundancy (number of bits) of error correction codes between an x-polarization frame and a y-polarization frame. Thus, the x-polarization error correction decoder 57 and the y-polarization error correction decoder 58 perform decoding based on the error correction codes having mutually different redundancies. After decoding the x-polarization frames and the y-polarization frames, the x-polarization error correction decoder 57 and the y-polarization error correction decoder 58 transmit the frames for x-polarization and the frames for y-polarization to the frame decoder 59, respectively.

Next, the frame decoder 59 will be described. The frame decoder 59 is a part which decodes the inputted digital signal based on a frame format having a length designated for each polarization. Then, the frame decoder 59 outputs the decoded electric signal (signal data) to the outside.

Next, the x-polarization test signal error-number counter 55, the y-polarization test signal error-number counter 56, and the monitoring/controlling part 60 will be described. The x-polarization test signal error-number counter 55, the y-polarization test signal error-number counter 56, and the monitoring/controlling part 60 are parts used for calculation of redundancy-changing bit-number information.

A method for calculating redundancy-changing bit-number information will be described. The calculation of redundancy-changing bit-number information is performed by transmitting a test signal composed of a pseudorandom sequence to the receiving device 3 from the test signal generator 26 of the transmission device 1. The test signal is transmitted to the receiving device 3 via the same path as normal signal data. As mentioned above, a test signal for x-polarization is transmitted from the frame distributer 54 of the receiving device 3 to the x-polarization test signal error-number counter 55. Likewise, a test signal for y-polarization is transmitted from the frame distributer 54 to the y-polarization test signal error-number counter 56.

After that, the x-polarization test signal error-number counter 55 having received the test signal for x-polarization and the y-polarization signal error-number counter 56 having received the test signal for y-polarization measure the number of bit errors of the received x-polarization test signal and the number of bit errors of the y-polarization test signal, respectively. Then, the x-polarization test signal error-number counter 55 and the y-polarization test signal error-number counter 56 calculate BERs (Bit Error Rates) with respect to the respective polarizations based on the measured numbers of bit errors, respectively. After that, the x-polarization test signal error-number counter 55 and the y-polarization test signal error-number counter 56 transmit the calculated BERs with respect to the respective polarizations, to the monitoring/controlling part 60.

The monitoring/controlling part 60 having received the BERs of x-polarization and y-polarization obtains a difference between the BERs of x-polarization and y-polarization, and determines the value of "x" so that the values of the BERs coincide. Then, the monitoring/controlling part 60 notifies the value of "x" and information which is plus and which is minus between x-polarization and y-polarization, as redundancy-changing bit-number information, to the transmission device 1.

As a means for notifying from the monitoring/controlling part 60 to the transmission device 1, it is possible to use a control path which is generally used between the optical transmission devices (between the transmission device 1 and the receiving device 3). For example, in a case where the optical transmitter and the optical receiver are oppositely connected, it is possible to configure to be capable of notifying redundancy-changing bit-number information, by using the header portion of a frame of each polarization shown in FIG. 4. Alternatively, it is also possible to configure to write information such as the value of "x" into a prepared ROM or the like and retrieve the information at the time of startup of the frame encoder 21. As mentioned above, by using thus calculated redundancy-changing bit-number information, adjustment of the redundancy of an error correction code is performed.

The configuration of the digital signal processor 33 has been described above. With a configuration as described above, the digital signal processor 33 can demodulate signal data before modulated by the transmission device 1 from an inputted digital signal, and output to the outside.

Next, the operation of the optical signal transmission system in this exemplary embodiment will be described referring to FIGS. 7 to 11. First, the operation of the transmission device 1 will be described referring to FIG. 7.

(Operation)

First, the transmission device 1 receives an electric signal (signal data). In the transmission device 1, the transmission signal processor 11 firstly receives the electric signal.

Next, the transmission signal processor 11 having received the electric signal (signal data) encodes the received signal data into frames including error correction codes (for x-polarization and y-polarization). After encoding, the transmission signal processor 11 distributes the encoded signal data to four lanes (XI, XQ, YI, and YQ) (S001). When distributing the signal data, the transmission signal processor 11 adjusts the destinations of distribution so as to distribute signal data for x-polarization to the optical modulator 13a and distribute signal data for y-polarization to the optical modulator 13b.

Subsequently, the optical modulators 13a and 13b receive the encoded signal data distributed by the transmission signal processor 11, respectively. Moreover, into the optical modulators 13a and 13b, a constant-power CW light is inputted from the light source 12. Then, in accordance with the received signal data, the optical modulators 13a and 13b each execute phase modulation of the same-direction polarization on the CW light inputted from the light source 12 (S002). The optical signals subjected to phase modulation by the optical modulators 13a and 13b are outputted to the polarization multiplexer 14, respectively.

The optical signals subjected to phase modulation by the optical modulators 13a and 13b are inputted into the polarization multiplexer 14. Then, the polarization multiplexer 14 that the optical signals are inputted multiplexes the phase-modulated optical signals inputted from the respective optical modulators 13a and 13b. To be specific, the polarization multiplexer 14 makes the phase-modulated optical signal inputted from the optical modulator 13a an x-polarized phase-modulated signal. Moreover, the polarization multiplexer 14 shifts the polarization angle of the phase-modulated optical signal inputted from the optical modulator 13b to make the phase-modulated optical signal a y-polarization phase-modulated optical signal. Then, the polarization multiplexer 14 multiplexes the x-polarization phase-modulated signal and the y-polarization phase modulated signal (S003).

After that, the polarization multiplexer 14 outputs the polarization-multiplexed multiple-level phase-modulated optical signal to the optical transmission path 2. The operation of the transmission device 1 has been described above. The transmission device 1 thus operates to output the optical signal corresponding to the inputted electric signal. Then, the optical signal outputted by the transmission device 1 is transmitted to the receiving device 3 via the optical transmission path 2.

Next, the detailed operation of the transmission signal processor 11 in the transmission device 1 will be described referring to FIG. 8.

As mentioned above, when the transmission device 1 receives an electric signal (signal data), the transmission signal processor 11 first receives the electric signal. When the transmission signal processor 11 receives the electric signal, the frame encoder 21 in the transmission signal processor 11 first receives the electric signal. Moreover, the frame encoder 21 acquires redundancy-changing bit-number information by using the redundancy-changing bit-number information acquiring means.

Then, the frame encoder 21 having received the electric signal encodes the received electric signal in accordance with a required frame format (S101). To be specific, upon receiving the electric signal (signal data), the frame encoder 21 provides transmission data corresponding to signal data of the number of bits corresponding to the redundancy-changing bit-number information with a header including control information (e.g., redundancy-changing bit-number information, etc.). Thus, the frame encoder 21 alternately generates a frame for x-polarization (an x-polarization frame) and a frame for y-polarization (a y-polarization frame) of the number of bits corresponding to the redundancy-changing bit-number information.

Then, the frame encoder 21 transmits the x-polarization signal data subjected to bit-multiplexing per frame, to the x-polarization error correction encoder 22. Likewise, the frame encoder 21 transmits the y-polarization signal data subjected to bit-multiplexing per frame, to the y-polarization error correction encoder 23.

Next, the x-polarization error correction encoder 22 receives the x-polarization signal data. Subsequently, the x-polarization error correction encoder 22 reads the redundancy-changing bit-number information written in the header portion of the (x-polarization) frame. Then, the x-polarization error correction encoder 22 provides the received (x-polarization) frame with an error correction code (for x-polarization) of redundancy (the number of bits) corresponding to the redundancy-changing bit-number information (S102). Likewise, the y-polarization error correction encoder 23 receives the signal data for y-polarization. Subsequently, the y-polarization error correction encoder 23 reads the redundancy-changing bit-number information written in the header portion of the (y-polarization) frame. Then, the y-polarization error correction encoder 23 provides the received (y-polarization) frame with an error correction code (for y-polarization) of redundancy (the number of bits) corresponding to the redundancy-changing bit-number information (S103).

After that, the x-polarization error correction encoder 22 transmits the x-polarization frame provided with the error correction code, to the data distributer 24. Likewise, the y-polarization error correction encoder 23 transmits the y-polarization frame provided with the error correction code, to the data distributer 24.

The data distributer 24 receives the frames provided with the error correction codes transmitted by the x-polarization error correction encoder 22 and the y-polarization error correction encoder 23. Then, the data distributer 24 reads the header portion (e.g., the redundancy-changing bit-number information) of each of the frames. The data distributer 24 distributes the x-polarization frames to the two transmission lanes for transmission to the optical modulator 13a. Likewise, the data distributer 24 distributes the y-polarization frames to the two transmission lanes for transmission to the optical modulator 13b (S104).

After that, the signal output amplifiers 25 on the respective transmission lanes receive the frames distributed by the data distributer 24. Then, the signal output amplifiers 25 execute proper output amplitude adjustment on the respective frames (electric signals) having been received thereby (S105). After that, the signal output amplifiers 25 output the electric signals subjected to the proper output amplitude adjustment, to the optical modulators 13a and 13b, respectively.

The detailed operation of the transmission signal processor 11 has been described above. Because the transmission signal processor 11 thus operates, the transmission device 1 can transmit a frame provided with an error correction code of proper redundancy corresponding to redundancy-changing bit-number information.

Next, the operation of the receiving device 3 will be described referring to FIG. 9.

As mentioned above, the optical signal outputted from the transmission device 1 is transmitted to the receiving device 3 via the optical transmission path 2. The optical signal transmitted from the transmission device 1 is firstly transmitted to the coherent detector 31 in the receiving device 3.

The coherent detector 31 mixes the optical signal received from the transmission device 1 with a local oscillation light outputted from the local oscillation light source 42, performs coherent detection, and outputs an electric signal corresponding to the received optical signal (S201).

To be specific, the polarization beam splitter 41a receives the optical signal received from the transmission device 1. Then, the polarization beam splitter 41a splits the received optical signal into an x-direction polarized wave (an x-polarized wave) and a y-direction polarized wave (a y-polarized wave). Then, the polarization beams splitter 41a transmits the x-polarized wave obtained by splitting the optical signal to the optical hybrid circuit 43a. Likewise, the polarization beam splitter 41a transmits the y-polarized wave obtained by splitting the optical signal to the optical hybrid circuit 43b.

Further, the polarization beam splitter 41b receives the local oscillation light outputted from the local oscillation light source 42. Then, the polarization beam splitter 41b splits the received local oscillation light into an x-direction polarized wave (an x-polarized wave) and a y-direction polarized wave (a y-polarized wave). The polarization beam splitter 41b transmits the x-polarized wave obtained by splitting the local oscillation light to the optical hybrid circuit 43a. Likewise, the polarization beam splitter 41b transmits the y-polarized wave obtained by splitting the local oscillation light to the optical hybrid circuit 43b.

Thus, the optical hybrid circuit 43a receives the x-polarized wave obtained by splitting the optical signal, from the polarization beam splitter 41a. Moreover, the optical hybrid circuit 43a receives the x-polarized wave obtained by splitting the local oscillation light, from the polarization beam splitter 41b. Then, the optical hybrid circuit 43a mixes the received x-direction optical signal and the received x-direction local oscillation light, and outputs as one pair of lights whose phases are mutually different by 90 degrees, to the O/E converters 44.

Likewise, the optical hybrid circuit 43b receives the y-polarized wave obtained by splitting the optical signal, from the polarization beam splitter 41a. Moreover, the optical hybrid circuit 43b receives the y-polarized wave obtained by splitting the local oscillation light, from the polarization beam splitter 41b. Then, the optical hybrid circuit 43b mixes the received y-direction optical signal and the received y-direction local oscillation light, and outputs as one pair of lights whose phases are mutually different by 90 degrees, to the O/E converters 44.

The respective O/E converters 44 perform photoelectric conversion on the optical signals inputted thereinto. After that, the respective electric signals obtained by converting the light through the photoelectric conversion are subjected to proper output amplitude adjustment, and outputted from the coherent detector 31 to the outside. By thus operating, the coherent detector 31 can output the analog electric signals corresponding to the received optical signals.

The analog electric signals outputted by the coherent detector 31 are received by the respective A/D converters 32. The respective A/D converters 32 sample the received analog electric signals at proper time intervals, thereby converting into quantized digital electric signals (S202). Then, the respective A/D converters 32 transmit the digital electric signals obtained by converting the analog electric signals, to the digital signal processor 33.

The digital signal processor 33 receives the digital signals. The digital signal processor 33 performs equalization of the received digital signals and then decodes. Consequently, the receiving device 3 can demodulate the electric signals before modulated by the transmission device 1. After that, the receiving device 3 outputs the electric signals (signal data) received from the transmission device 1, to the outside.

The operation of the receiving device 3 has been described above. Next, the detailed operation of the digital signal processor 33 in the receiving device 3 will be described referring to FIG. 10.

As mentioned above, the digital signal processor 33 receives digital signals converted from analog electric signals by the A/D converters 32. Then, the digital signal processor 33 firstly performs polarization division of the digital electric signals in the polarization dividing part 51.

To be specific, by applying an adaptive equalization filter such as CMA, the polarization dividing part 51 performs polarization division of the digital electric signals, and retrieves x-polarization signal data and y-polarization signal data (S301). Then, the polarization dividing part 51 transmits the retrieved signal data (digital electric signals) to the frequency/phase compensating part 52.

Next, the frequency/phase compensating part 52 receives the signal data transmitted from the polarization dividing part 51. Then, the frequency/phase compensating part 52 executes compensation of phase rotation and frequency offset on the received signal data (S302). After that, the frequency/phase compensating part 52 transmits the compensated signal data to the signal identifying part 53.

Subsequently, the signal identifying part 53 receives the signal data transmitted from the frequency/phase compensating part 52. Then, by using information embedded in the frame format of each frame, the signal identifying part 53 identifies whether the received signal data is signal data showing logic 0 or logic 1 (S303). After that, the signal identifying part 53 transmits the identified signal data to the frame distributer 54.

Upon receiving the identified signal data, the frame distributer 54 reads the header portion of a frame composing each signal data, and thereby determines whether the signal data is for x-polarization or y-polarization. Then, the frame distributer 54 distributes the received signal data to the x-polarization error correction decoder 57 and the y-polarization error correction decoder 58 (S304). To be specific, the frame distributer 54 transmits signal data (a frame) for x-polarization to the x-polarization error correction decoder 57. Likewise, the frame distributer 54 transmits signal data (a frame) for y-polarization to the y-polarization error correction decoder 58.

Subsequently, the x-polarization error correction decoder 57 having received the x-polarization signal data (frame) decodes the received x-polarization signal data based on an error correction code in the signal data (S305). Then, the x-polarization error correction decoder 57 transmits the signal data decoded based on the error correction code in the frame, to the frame decoder 59.

Further, the y-polarization error correction decoder 58 having received the y-polarization signal data (frame) decodes the received y-polarization signal data based on an error correction code in the signal data (S306). Then, the y-polarization error correction decoder 58 transmits the signal data decoded based on the error correction code in the frame, to the frame decoder 59.

As a result of the abovementioned operation, the frame decoder 59 receives the signal data decoded based on the error correction codes and transmitted from the x-polarization error correction decoder 57 and the y-polarization error correction decoder 58, respectively. Then, the frame decoder 59 decodes the received signal data based on a frame format of a designated length of each polarization (S307). The frame decoder 59 then outputs the decoded signal data to the outside.

The operation of the digital signal processor 33 has been described above. Because the digital signal processor 33 thus operates, the receiving device 3 can correct an electric signal converted from a received optical signal into a proper form, and then output the electric signal to the outside of the receiving device 3.

Next, the operation of the optical transmission system at the time of calculation of redundancy-changing bit-number information will be described referring to FIG. 11.

Firstly, in response to a request from the frame encoder 21, the test signal generator 26 generates a test signal composed of a pseudorandom sequence. Then, the test signal generator 26 transmits the generated test signal to the frame encoder 21.

The test signal generated by the test signal generator 26 is modulated into an x-polarization optical signal and a y-polarization optical signal through the same route as a normal electric signal inputted from outside. The optical signals are multiplied, and then transmitted from the transmission device 1 to the optical transmission path 2. After that, the receiving device 3 receives the test optical signals transmitted via the optical transmission path in the same manner as in the normal case.

Also in the receiving device 3, the same process as in the normal case is performed. That is, the test optical signals received by receiving device 3 are converted into analog electric signals by the coherent detector 31. Then, the A/D converters 32 convert the analog electric signals into digital electric signals. After that, the digital signal processor receives the digital electric signals.

Also in the digital signal processor, the test signals trace the same route, and the frame distributer 54 receives the test signals. Then, the frame distributer 54 reads the header portions of the received test signals (frames). Consequently, the frame distributer 54 knows the frames are test signals. Moreover, the frame distributer 54 judges whether the test signals are for x-polarization or for y-polarization. After that, the frame distributer 54 distributes the received test signals to the test signal error-number counters (S401). To be specific, the frame distributer transmits the test signal transmitted as x-polarization (for x-polarization) to the x-polarization test signal error-number counter 55. Likewise, the frame distributer transmits the test signal transmitted as y-polarization (for y-polarization) to the y-polarization test signal error-number counter 56.

Subsequently, the x-polarization test signal error-number counter 55 and the y-polarization test signal error-number counter 56 measure the numbers of bit errors of the received test signals, respectively (S402). Then, the x-polarization test signal error-number counter 55 and the y-polarization test signal error-number counter 56 each calculate a BER (Bit Error Rate) from the measured number of bit errors (S403). Then, the x-polarization test signal error-number counter 55 and the y-polarization test signal error-number counter 56 each transmit the calculated BER to the monitoring/controlling part 60.

Next, the monitoring/controlling part 60 receives the BERs. The monitoring/controlling part 60 obtains a difference of the BERs between x-polarization and y-polarization, and determines the value of "x" so that the values of the BERs coincide (S404). Then, the monitoring/controlling part 60 notifies the value of "x" and information which is plus and which is minus between x-polarization and y-polarization, as redundancy-changing bit-number information, to the transmission device 1. As a notification method, various methods can be used as mentioned above.

The operation of the optical transmission system at the time of calculation of redundancy-changing bit-number information has been described above.

Thus, the transmission device according to this exemplary embodiment includes the frame decoder, the error correction encoder, and the redundancy-changing bit-number information acquiring means (the transmission loss information acquiring part). With such a configuration, the error correction encoder can give an error correction code having redundancy corresponding to redundancy-changing bit-number information acquired by the redundancy-changing bit-number information acquiring means. As a result, the transmission device can transmit an optical signal while sufficiently dealing with deterioration of the performance of an error correction code.

Further, the error correction encoder in this exemplary embodiment is configured so that the redundancy of an x-polarization error correction code and the redundancy of a y-polarization error correction code differ based on redundancy-changing bit-number information. With such a configuration, the error correction encoder can give an error correction code having redundancy corresponding to BER. As a result, it is possible to eliminate a difference in PDL (Polarization Dependent Loss), and it is possible to more securely transmit optical signals.

Further, the frame encoder in this exemplary embodiment is configured to generate a frame for x-polarization (first direction) and a frame for y-polarization (second direction) of the numbers of bits corresponding to redundancy-changing bit-number information. With such a configuration, the frame encoder can generate frames so that the total bit lengths of the x-polarization frame and the y-polarization frame become equal in a case where the error correction encoder provides the x-polarization frame and the y-polarization frame with error correction codes having different redundancies. As a result, it is possible to solve a problem of a difference in transmission time due to a difference in number of bits between x-polarization and y-polarization, and more securely transmit optical signals.

Further, by thus configuring the transmission device including the frame encoder, the error correction encoder and the redundancy-changing bit-number information acquiring means, it is possible to keep transmission characteristic equivalent to that of a high-cost optical device. Then, it is possible to ease the PDL specification of the high-cost optical device. As a result, it is possible to reduce the cost of the optical device.

Further, the receiving device in this exemplary embodiment includes the optical signal receiver (the coherent detector), the transmission loss information detector (the test signal error-number counter), the transmission loss information transmitter (the monitoring/controlling part), and the error correction decoders for the respective directions (x-polarization, y-polarization). With such a configuration, the receiving device can measure a bit error at the time of transmitting an optical signal. As a result, it is possible to calculate and transmit a BER to the transmission device, and it is possible to realize the operation of the transmission device described above. Moreover, because transmission loss information is transmitted to the transmission device, frames provided with error correction codes having different redundancies are transmitted from the transmission device as described above. Because the receiving device includes the x-polarization error correction decoder and the y-polarization error correction decoder, it is possible to decode based on the error correction codes having redundancies different from each other. As a result, it is possible to realize transmission of signal data from the transmission device to the receiving device.

<Second Exemplary Embodiment>

Figure 12:
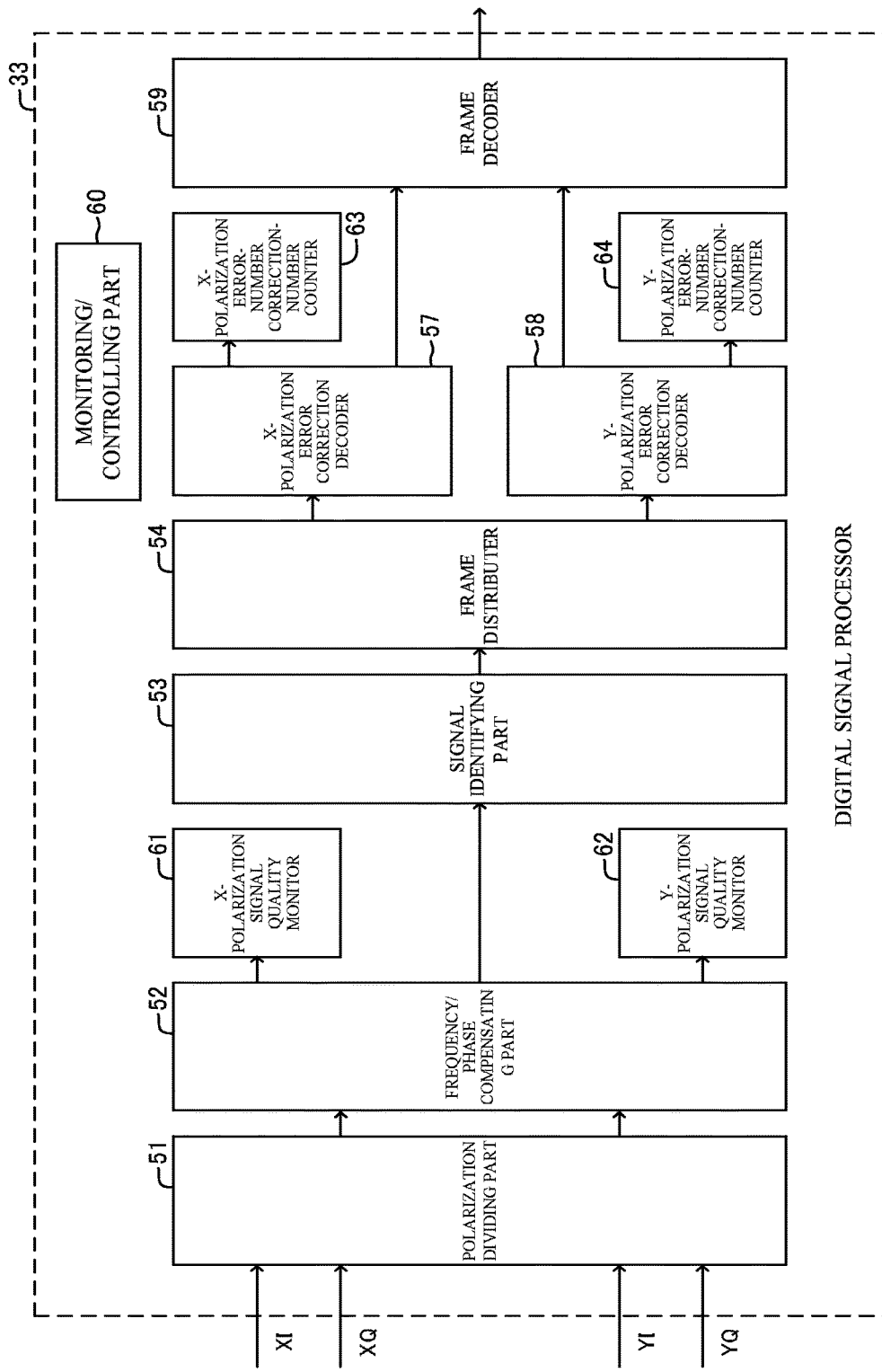
FIG. 12 is a block diagram showing the configuration of a digital signal processor in a second exemplary embodiment.

Next, a second exemplary embodiment of the present invention will be described referring to FIG. 12. FIG. 12 is a block diagram showing the configuration of the digital signal processor 33 in this exemplary embodiment.

(Configuration)

The configuration of the transmission device 1 in this exemplary embodiment is almost the same as in the first exemplary embodiment. However, as described later, a test signal is not used at the time of calculation of redundancy-changing bit-number information in this exemplary embodiment. Therefore, the transmission device 1 in this exemplary embodiment may be configured without the test signal generator 26. As in the first exemplary embodiment, the transmission device 1 and the receiving device 3 are connected via the optical transmission path 2.

Further, the configuration of the receiving device 3 is almost the same as in the first exemplary embodiment. That is, the receiving device 3 in this exemplary embodiment includes the coherent detector 31, the A/D converters 32, and the digital signal processor 33. However, the digital signal processor 33 has a different configuration from the configuration in the first exemplary embodiment. Therefore, a different part of the configuration of the digital signal processor 33 from the configuration in the first exemplary embodiment will be specifically described below.

As shown in FIG. 12, as in the first exemplary embodiment, the digital signal processor 33 in this exemplary embodiment includes the polarization dividing part 51, the frequency/phase compensating part 52 (it has part of the role of the transmission loss information detector in this exemplary embodiment), the signal identifying part 53, the frame distributer 54, the x-polarization error correction decoder 57, the y-polarization error correction decoder 58, the frame decoder 59, and the monitoring/controlling part 60 (it has part of the role of the transmission loss information detector). Moreover, the digital signal processor 33 includes an x-polarization signal quality monitor 61 and a y-polarization signal quality monitor 62. The digital signal processor 33 in this exemplary embodiment can be configured to include an x-polarization error-number correction-number counter 63 and a y-polarization error-number correction-number counter 64, instead of the x-polarization signal quality monitor 61 and the y-polarization signal quality monitor 62. Moreover, the digital signal processor 33 may include all of the x-polarization signal quality monitor 61, the y-polarization signal quality monitor 62, the x-polarization error-number correction-number counter 63 and the y-polarization error-number correction-number counter 64.

The digital signal processor 33 in this exemplary embodiment may be configured not to include the x-polarization test signal error-number counter 55 and the y-polarization test signal error-number counter 56, which are included in the first exemplary embodiment.

The x-polarization signal quality monitor 61 and the y-polarization signal quality monitor 62 are configured to be capable of communicating with the frequency/phase compensating part 52 by using electric signals as shown in FIG. 12. Moreover, the x-polarization signal quality monitor 61 and the y-polarization signal quality monitor 62 are configured to be capable of communicating with the monitoring/controlling part 60 by using electric signals through transmission lanes, which are not shown in the drawings. Connection relations of the other components are the same as in the first exemplary embodiment.

Further, in a case where the x-polarization error-number correction-number counter 63 and the y-polarization error-number correction-number counter 64 are used, the x-polarization error-number correction-number counter 63 is configured to be capable of communicating with the x-polarization error correction decoder 57 by using electric signals. Moreover, the y-polarization error-number correction-number counter 64 is configured to be capable of communicating with the y-polarization error correction decoder 58 by using electric signals. Further, the x-polarization error-number correction-number counter 63, the y-polarization error-number correction-number counter 64 and the monitoring/controlling part 60 are configured to be capable of communicating electric signals through transmission lanes, which are not shown in the drawings. Below, a description will be made focusing on a different part of the configuration in this exemplary embodiment from the configuration in the first exemplary embodiment.

Because the polarization dividing part 51 has the same configuration as in the first exemplary embodiment, a detailed description thereof will be omitted.

The frequency/phase compensating part 52 has the same configuration as in the first exemplary embodiment. In addition to the configuration in the first exemplary embodiment, the frequency/phase compensating part 52 in this exemplary embodiment is configured to calculate the quality of signal data to be compensated (a signal quality) in real time when compensating phase rotation and frequency offset. The signal quality calculated by the frequency/phase compensating part 52 is information which becomes the basis of calculation of redundancy-changing bit-number information. The signal quality is calculated based on phase rotation, frequency offset, the degree of bit errors, and so on.

The x-polarization signal quality monitor 61 and the y-polarization signal quality monitor 62 are parts each acquiring signal quality information showing a signal quality calculated by the frequency/phase compensating part 52. The x-polarization signal quality monitor 61 and the y-polarization signal quality monitor 62 transmit the signal quality information acquired from the frequency/phase compensating part 52, to the monitoring/controlling part 60.

The signal identifying part 53, the frame distributer 54, the x-polarization error correction decoder 57, the y-polarization error correction decoder 58, and the frame decoder 59 have the same configurations as in the first exemplary embodiment as the polarization dividing part 51 does. Therefore, a detailed description thereof will be omitted.

The monitoring/controlling part 60 acquires signal quality information from the x-polarization signal quality monitor 61 and the ye-polarization signal quality monitor 62. Then, based on the signal quality information, the monitoring/controlling part 60 obtains a difference between x-polarization and y-polarization, and determines the value of "x" so that the values of the signal quantity information coincide. Then, the monitoring/controlling part 60 notifies the value of "x" and information which is plus and which is minus between x-polarization and y-polarization, as redundancy-changing bit-number information, to the transmission device 1. A means for notifying from the monitoring/controlling part 60 to the transmission device 1 is the same as in the first exemplary embodiment.

The x-polarization error-number correction-number counter 63 and the y-polarization error-number correction-number counter 64 are parts which count the numbers of corrections when the x-polarization error correction decoder 57 and the y-polarization error correction decoder 58 decode based on error correction codes, respectively. Correction-number information showing the numbers of corrections counted by the x-polarization error-number correction-number counter 63 and the y-polarization error-number correction-number counter 64 is transmitted to the monitoring/controlling part 60. Then, the value of "x" is determined by the monitoring/controlling part 60.

Thus, the digital signal processor 33 in this exemplary embodiment includes the x-polarization signal quality monitor 61 and the y-polarization signal quality monitor 62. The frequency/phase compensating part 52 is configured to calculate a signal quality. With such a configuration, the optical transmission system can obtain the value of "x" that is redundancy-changing bit-number information in service (while transmitting signal data actually). As a result, it is possible to deal with not only PDL fixedly caused by the optical modulators 13a and 13b and the polarization multiplexer 14, but also PDL that the amount of deterioration changes with time.

<Third Exemplary Embodiment>

Figure 13:
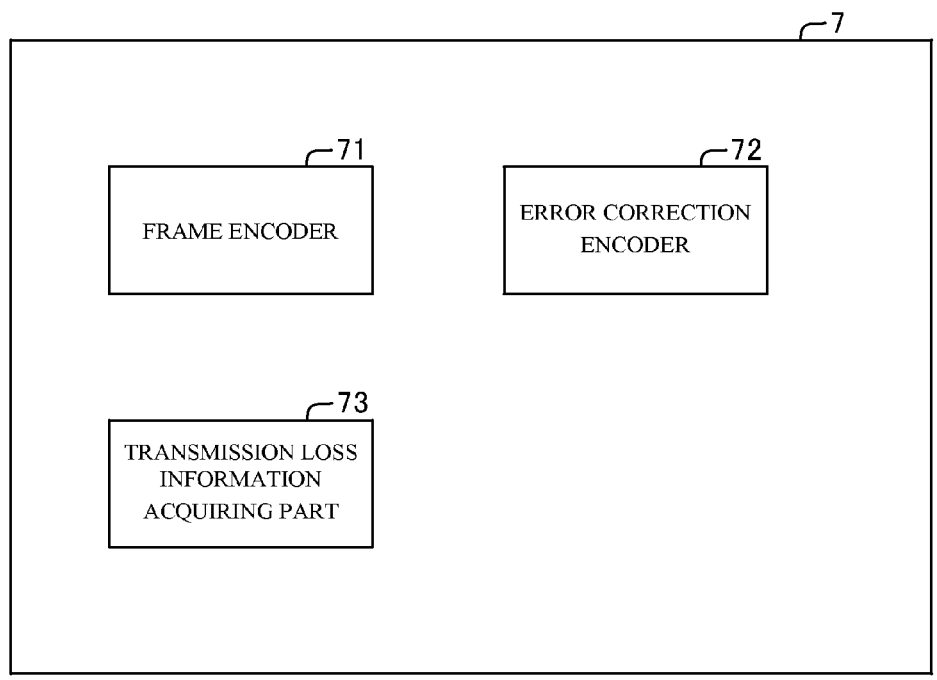
FIG. 13 is a block diagram showing the configuration of a transmission device in a third exemplary embodiment.
Figure 14:
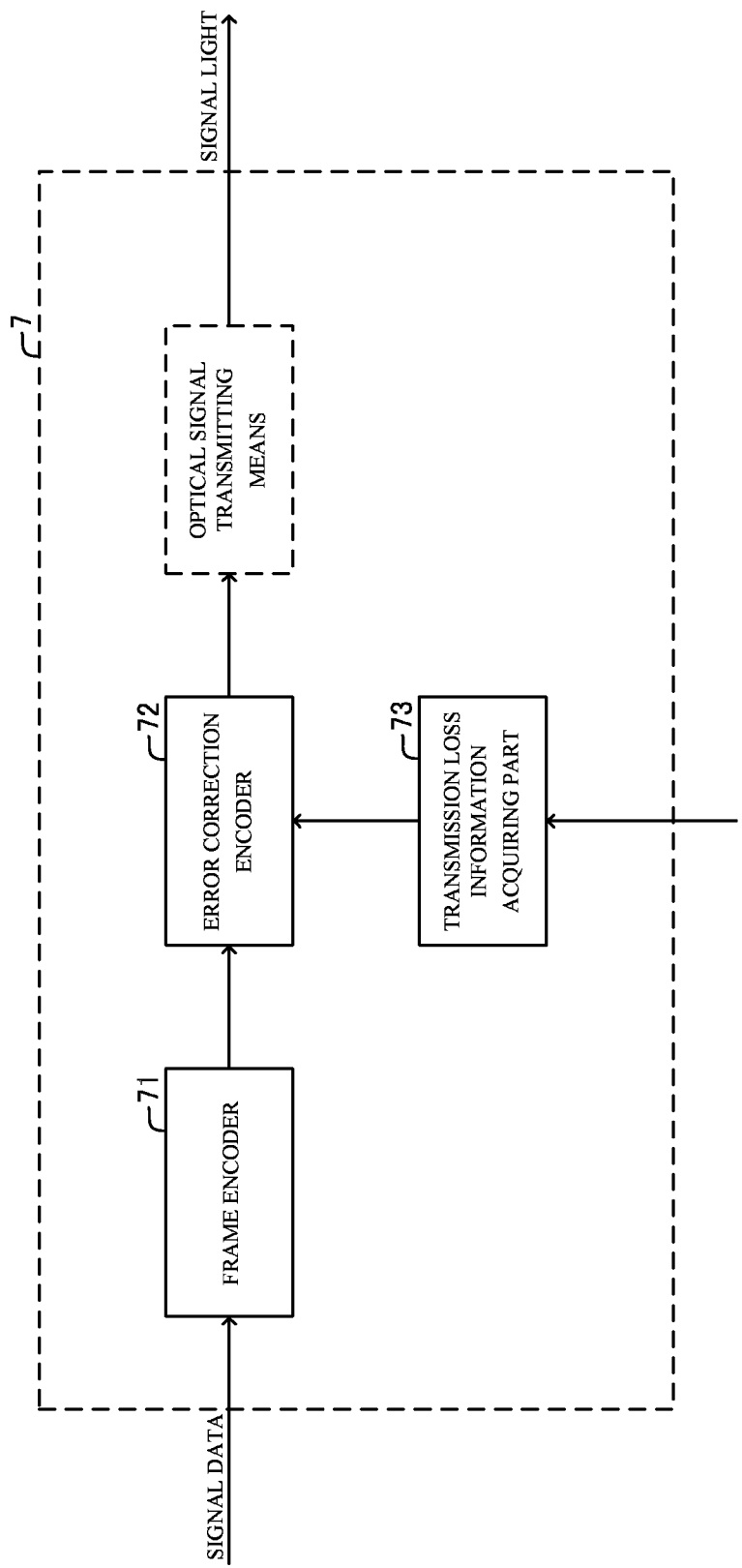
FIG. 14 is a block diagram showing, with arrows, the flow of signal data and an optical signal in the transmission device shown in FIG. 13.
Figure 15:
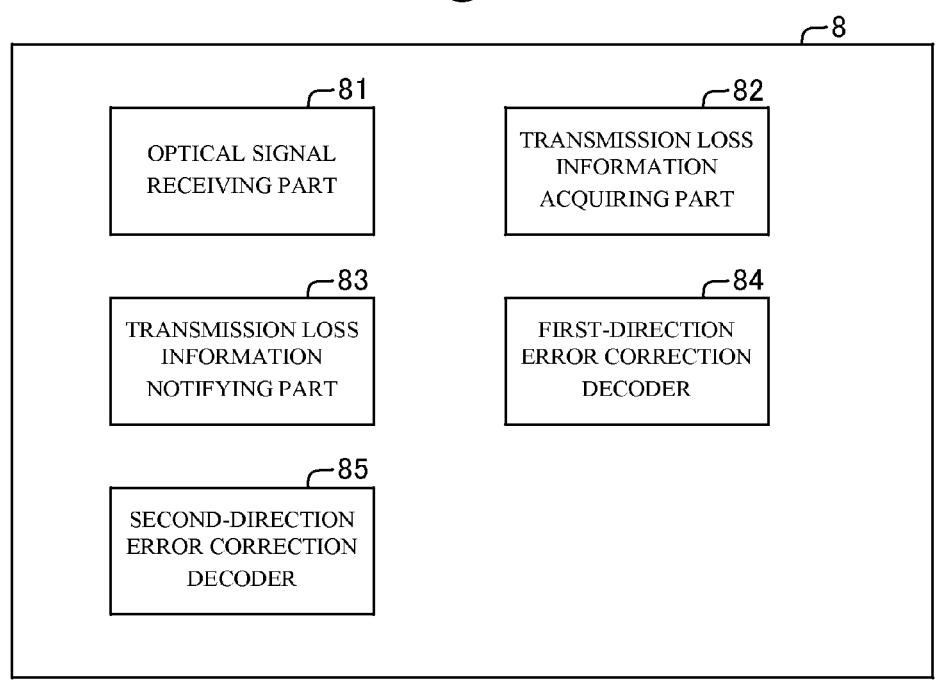
FIG. 15 is a block diagram showing the configuration of a receiving device in the third exemplary embodiment.
Figure 16:
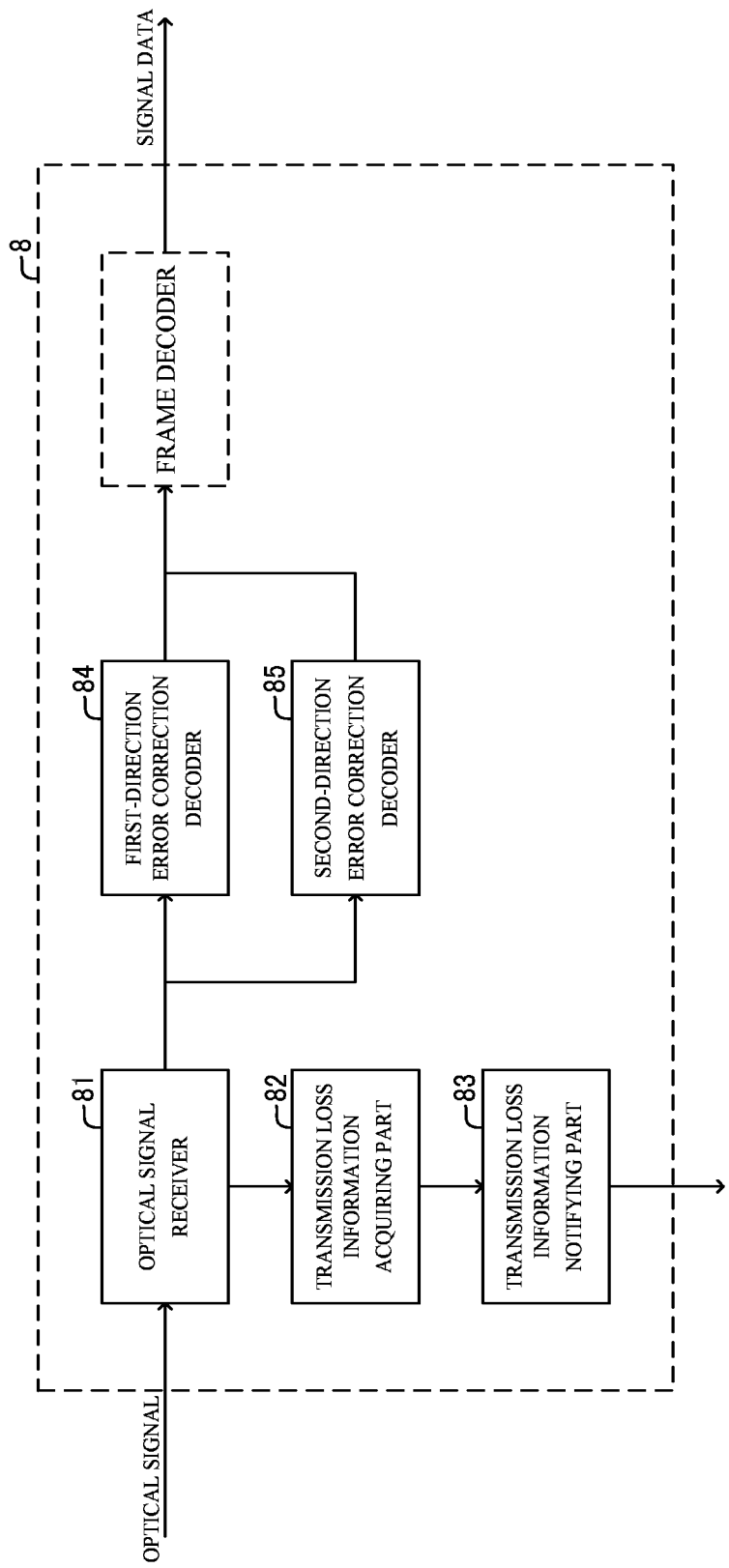
FIG. 16 is a block diagram showing, with arrows, the flow of signal data and an optical signal in the receiving device shown in FIG. 15.

Next, a third exemplary embodiment of the present invention will be described referring to FIGS. 13 to 16. FIG. 13 is a block diagram showing the overview of the configuration of a transmission device 7 in this exemplary embodiment. FIG. 14 is a block diagram showing, by using arrows, the flow of an electric signal and an optical signal in the transmission device 7. FIG. 15 is a block diagram showing the overview of the configuration of a receiving device 8 in this exemplary embodiment. FIG. 16 is a block diagram showing, by using arrows, the flow of an electric signal and an optical signal in the receiving device 8.

In the third exemplary embodiment, the transmission device 7 that encodes a received electric signal and transmits a polarization-multiplexed optical signal and the receiving device 8 that receives the optical signal transmitted from the transmission device 7 will be described. In this exemplary embodiment, the overview of the configurations of the transmission device 7 and the receiving device 8 will be described. Moreover, in this exemplary embodiment, the transmission device 7 and the receiving device 8 are connected via a transmission path so that an optical signal can be transmitted from the transmission device 7 to the receiving device 8.

(Configuration)

Firstly, the transmission device 7 will be described. As shown in FIG. 13, the transmission device 7 includes a frame encoder 71, an error correction encoder 72, and a transmission loss information acquiring part 73. Moreover, the transmission device 7 includes an optical signal transmitting means, which is not shown in the drawings. The transmission loss information acquiring part 73 may be configured in a manner that the frame encoder 71 includes a function as the transmission loss information acquiring part 73.

Further, as shown in FIG. 14, the frame encoder 71 and the error correction encoder 72 are configured to be capable of transmission of electric signals, the transmission loss information acquiring part 73 and the error correction encoder 72 are configured to be capable of transmission of electric signals, and the error correction code encoder 72 and the optical signal transmitting means are configured to be capable of transmission of electric signals. Moreover, the transmission loss information acquiring part 73 and the frame encoder 71 may be configured to be capable of transmitting an electric signal. Below, the respective components of the transmission device 7 will be described.

The frame encoder 71 is a part which encodes received electric signal (signal data) in accordance with a predetermined frame format. Then, after encoding the signal data, the frame encoder 71 transmits the encoded signal data to the error correction encoder 72.

The error correction encoder 72 is a part which provides the encoded signal data encoded by the frame encoder 71 with an error correction code having predetermined redundancy (the number of bits). Then, after providing the encoded signal data with the error correction code, the error correction encoder 72 transmits the encoded signal data provided with the error correction code to the optical signal transmitting means. The details of redundancy of the error correction code will be described later.

The transmission loss information acquiring part 73 is a part which acquires transmission loss information based on a loss on encoded signal data provided with an error correction code at the time of transmission of the encoded signal data, from the receiving device 8 that is a transmission destination. The transmission loss information acquiring part 73 transmits the acquired transmission loss information to the error correction encoder 72. The transmission loss information may be acquired from the receiving device 8 by using any means, such as using a control path which is generally used between optical transmission devices.

The redundancy of an error correction code given by the error correction encoder 72 will be described. In this exemplary embodiment, the redundancy of an error correction code is adjusted based on transmission loss information. That is, the error correction encoder 72 adjusts the redundancy of an error correction code given to encoded signal data, based on transmission loss information acquired by the transmission loss information acquiring part 73.

The optical signal transmitting means modulates an optical signal with encoded signal data provided with an error correction code received from the error correction encoder 72. Then, after performing polarization multiplexing of the modulated optical signal, the optical signal transmitting means outputs the optical signal to a transmission path. As the optical signal transmitting means in this exemplary embodiment, it is possible to use a general configuration in a transmission device transmitting a polarization-multiplexed optical signal. Therefore, the detailed description thereof will be omitted.

The transmission device 7 shown in this exemplary embodiment is a transmission device which transmits a polarization-multiplexed optical signal as mentioned above. Therefore, the transmission loss information acquiring part 73 can be configured to acquire, as transmission loss information, polarization dependent loss information based on a polarization dependent loss on a first-direction polarized wave and polarization dependent loss information based on a polarization dependent loss on a second-direction polarized wave, respectively. In this case, the error correction encoder 72 can be configured to adjust the redundancy of an error correction code given to encoded signal data transmitted as the first-direction polarized wave and the redundancy of an error correction code given to encoded signal data transmitted as the second-direction polarized wave, in accordance with the polarization dependent loss information, respectively.

The overview of the configuration of the transmission device 7 in this exemplary embodiment has been described above. Next, the receiving device 8 will be described. As shown in FIG. 15, the receiving device 8 includes an optical signal receiver 81, a transmission loss information acquiring part 82, a transmission loss information notifying part 83, a first-direction error correction decoder 84, and a second-direction error correction decoder 85. Moreover, the receiving device 8 includes a frame decoder, which is not shown in the drawings.

Further, as shown in FIG. 16, the optical signal receiver 81 and the transmission loss information acquiring part 82 are configured to be capable of communication of electric signals, the transmission loss information acquiring part 82 and the transmission loss information notifying part 83 are configured to be capable of communication of electric signals, the optical signal receiver 81 and the first-direction error correction decoder 84 are configured to be capable of communication of electric signals, and the optical signal receiver 81 and the second-direction error correction decoder 85 are configured to be capable of communication of electric signals. Moreover, the first-direction error correction decoder 84 and the frame decoder are configured to be capable of communication of electric signals, and the second-direction error correction decoder 85 and the frame decoder are configured to be capable of communication of electric signals. Below, the respective components of the receiving device 8 will be described.

The optical signal receiver 81 is a part which receives an optical signal transmitted from the transmission device 7 via the transmission path. That is, the optical signal receiver 81 receives a polarization-multiplexed optical signal obtained by multiplexing a first-direction polarized wave and a second-direction polarized wave obtained by modulating signal data composed of encoded signal data and an error correction code. Then, the optical signal receiver 81 converts the received optical signal into an electric signal. After that, the optical signal receiver 81 transmits the electric signal converted from the received optical signal, to the transmission loss information acquiring part 82. Moreover, the optical signal receiver 81 transmits the electric signal converted from the received optical signal, to the first-direction error correction decoder 84 and the second-direction error correction decoder 85.

The transmission loss information acquiring part 82 is a part which detects a loss incurred by encoded signal data transmitted from the transmission device 7 while the encoded signal data is being transmitted and acquires transmission loss information based on the loss incurred by the encoded signal data while the encoded signal data is being transmitted. The transmission loss information acquiring part 82, for example, measures the number of bit errors of each encoded signal data having been received, thereby detecting a loss incurred by the encoded signal data while the encoded signal data is being transmitted. Then, the transmission loss information acquiring part 82 acquires (calculates) transmission loss information based on the detected loss. After that, the transmission loss information acquiring part transmits the acquired transmission loss information to the transmission loss information notifying part 83.

The transmission loss information notifying part 83 is a part which notifies transmission loss information acquired by the transmission loss information acquiring part 82, to the transmission device 7. As a means for notifying transmission loss information from the transmission loss information notifying part 83 to the transmission device 7, any means may be used, such as using a control path which is generally used between optical transmission devices.

The first-direction error correction decoder 84 is a part which decodes encoded signal data transmitted by a first-direction polarized wave based on an error correction code given to the encoded signal data. The second-direction error correction decoder 85 is a part which decodes encoded signal data transmitted by a second-direction polarized wave based on an error correction code given to the encoded signal data. The encoded signal data decoded based on the error correction codes by the first-direction error correction decoder 84 and the second-direction error correction decoder 85 are transmitted to the frame decoder, respectively.

The frame decoder is a part which, based on a predetermined frame format, decodes each of the encoded signal data received from the first-direction error correction decoder 84 and the second-direction error correction decoder 85. After decoding the received encoded signal data into signal data, the frame decoder outputs the decoded signal data to the outside. Because the configuration of the frame decoder is a general one, a detailed description thereof will be omitted.

The overview of the configuration of the receiving device 8 in this exemplary embodiment has been described above.

A transmission method executed by the transmission device 7 described above is a transmission method of encoding a received electric signal and transmitting signal data that the encoded signal data is provided with a predetermined error correction code by using a polarization-multiplexed optical signal, and is a transmission method of acquiring transmission loss information based on a loss incurred by the encoded signal data during transmission and adjusting the redundancy of the error correction code given to the encoded signal data based on the transmission loss information. Because this transmission method exerts the same effect as the transmission device 7, it is possible to achieve the object of the present invention.

Further, because the optical transmission system including the transmission device 7 and the receiving device 8 described above exerts the same effect as the transmission device 7 and the receiving device 8 described above, it is possible to achieve the object of the present invention.

Further, by installing a program which causes a transmission device transmitting a polarization-multiplexed optical signal to realize a frame encoding means for encoding an electric signal in accordance with a predetermined frame format, an error correction encoding means for providing encoded signal data encoded by the frame encoding means with a predetermined error correction code, and a transmission loss information acquiring means for acquiring transmission loss information based on a loss incurred by encoded signal data provided with an error correction code at the time of transmission of the encoded signal data from a receiving device as a transmission destination and in which the error correction encoding means functions to adjust the redundancy of an error correction code given to encoded signal data based on transmission loss information acquired by the transmission loss information acquiring means, the same effect as the transmission device 7 described above is exerted, so that it is possible to achieve the object of the present invention.

A transmission method, an optical transmission system and a program having the abovementioned configurations have the same actions as the transmission device 7, and therefore, can achieve the object of the present invention.

<Supplementary Notes>

The whole or part of the exemplary embodiments disclosed above can be described as the following supplementary notes. Below, the overview of a transmission device and so on according to the present invention will be described. However, the present invention is not limited to the following configuration.

(Supplementary Note 1)

A transmission device transmitting a polarization-multiplexed optical signal, the transmission device including:

a frame encoder configured to encode an electric signal in accordance with a predetermined frame format;

an error correction encoder configured to provide encoded signal data as a result of the encoding by the frame encoder with a predetermined error correction code; and a transmission loss information acquiring part configured to acquire transmission loss information based on a loss that the encoded signal data provided with the error correction code incurs when the encoded signal data is transmitted, from a receiving device as a transmission destination, wherein the error correction encoder is configured to adjust a redundancy of the error correction code given to the encoded signal data, based on the transmission loss information acquired by the transmission loss information acquiring part.

According to this configuration, the transmission device includes the frame encoder, the error correction encoder, and the transmission loss information acquiring part. With such a configuration, the error correction encoder adjusts the redundancy of an error correction code given to encoded signal data, based on transmission loss information acquired b the transmission loss information acquiring part. As a result, the error correction encoder can give an error correction code that includes a redundancy corresponding to deterioration of the performance of an error correction code.

(Supplementary Note 2)

The transmission device according to Supplementary Note 1, wherein:

the transmission loss information acquiring part is configured to acquire polarization dependent loss information based on a polarization dependent loss incurred by a first-direction polarized wave and polarization dependent loss information based on a polarization dependent loss incurred by a second-direction polarized wave, as the transmission loss information, respectively; and the error correction encoder is configured to adjust the redundancy of the error correction code given to the encoded signal data transmitted as the first-direction polarized wave and the redundancy of the error correction code given to the encoded signal data transmitted as the second-direction polarized wave, in accordance with the polarization dependent loss information, respectively.

According to this configuration, the transmission loss information acquiring part is configured to acquire polarization dependent loss information based on a polarization dependent loss incurred by a first-direction polarized wave and polarization dependent loss information based on a polarization dependent loss incurred by a second-direction polarized wave, as transmission loss information, respectively. With such a configuration, the error correction encoder can adjust the redundancy of an error correction code given to encoded signal data transmitted as the first-direction polarized wave and the redundancy of an error correction code given to encoded signal data transmitted as the second-direction polarized wave, in accordance with the polarization dependent loss information, respectively. As a result, the error correction encoder can give error correction codes that include redundancies corresponding to the deterioration of the performances of error correction codes caused by the polarization dependent losses.

(Supplementary Note 3)

The transmission device according to Supplementary Note 2, wherein the error correction encoder is configured to, in accordance with a result of comparison between the polarization dependent loss information based on the polarization dependent loss incurred by the first-direction polarized wave and the polarization dependent loss information based on the polarization dependent loss incurred by the second-direction polarized wave, adjust the redundancy of the error correction code given to the encoded signal data transmitted as a polarization wave of a direction in which the polarization dependent loss is larger, so as to be longer than the redundancy of the error correction code given to the encoded signal data transmitted as a polarized wave of the other direction.

According to this configuration, the error correction encoder is configured to adjust the redundancy of an error correction code given to encoded signal data transmitted as a polarization wave of a direction in which a polarization dependent loss is larger, so as to be longer than the redundancy of an error correction code given to encoded signal data transmitted as a polarized wave of the other direction. With such a configuration, it becomes possible to deal with the deterioration of the performances of error correction codes in a better manner. As a result, it is possible to more securely transmit signal data.

(Supplementary Note 4)

The transmission device according to Supplementary Note 3, wherein the error correction encoder is configured to, in accordance with a result of comparison between the polarization dependent loss information based on the polarization dependent loss incurred by the first-direction polarized wave and the polarization dependent loss information based on the polarization dependent loss incurred by the second-direction polarized wave, adjust the redundancy of the error correction code given to the encoded signal data transmitted as a polarization wave of a direction in which the polarization dependent loss is smaller, so as to be shorter than the redundancy of the error correction code given to the encoded signal data transmitted as a polarized wave of the other direction.

(Supplementary Note 5)

The transmission device according to Supplementary Note 3 or 4, wherein the frame encoder is configured to, when the error correction encoder provides the encoded signal data transmitted as the first-direction polarized wave and the encoded signal data transmitted as the second-direction polarized wave with error correction codes of different redundancies, adjust a bit length of the encoded signal data transmitted as the first-direction polarized wave and a bit length of the encoded signal data transmitted as the second-direction polarized wave, in accordance with the redundancies of the respective error correction codes given by the error correction encoder.

According to this configuration, the frame encoder is configured to, so that the total bit length of encoded signal data provided with an error correction code transmitted as the first-direction polarized wave becomes equal to the total bit length of encoded signal data provided with an error correction code transmitted as the second-direction polarized wave, adjust the bit lengths of the encoded signal data transmitted as the polarized waves of the respective directions. With such a configuration, when the encoded signal data provided with the respective error correction codes are transmitted as the polarized waves of the respective directions, a difference will not be made in total bit numbers of the data of the respective directions. As a result, when the first-direction polarized wave and the second-direction polarized wave are multiplexed, a problem such as a difference of bit numbers between the first-direction polarized wave and the second-direction polarized wave, and it becomes possible to more securely transmit signal data.

(Supplementary Note 6)

A receiving device including:

an optical signal receiver configured to receive a polarization-multiplexed optical signal obtained by multiplexing a first-direction polarized wave and a second-direction polarized wave, each of which is obtained by modulating signal data composed of encoded signal data and an error correction signal;

a transmission loss information detector configured to detect a loss that the encoded signal data incurs while being transmitted, and acquire transmission loss information based on the loss that the encoded signal data incurs while being transmitted;

a transmission loss information notifying part configured to notify the transmission loss information acquired by the transmission loss information detector, to a transmission device;

a first-direction error correction decoder configured to decode encoded signal data transmitted by the first-direction polarized wave, based on the error correction code given to the encoded signal data transmitted by the first-direction polarized wave; and a second-direction error correction decoder configured to decode encoded signal data transmitted by the second-direction polarized wave, based on the error correction code given to the encoded signal data transmitted by the second-direction polarized wave.

According to this configuration, the receiving device includes the transmission loss information detector, the transmission loss information notifying part, the first-direction error correction decoder, and the second-direction error correction decoder. With such a configuration, it is possible to decode based on error correction codes with mutually different error correction codes by using the first-direction error correction decoder and the second-direction error correction decoder. As a result, it is possible to realize a receiving device corresponding to a transmission device that deals with the deterioration of the performances of error correction codes.

(Supplementary Note 7)

The receiving device according to Supplementary Note 6, wherein the transmission loss information detector is configured to measure numbers of bit errors of the encoded signal data transmitted as the first-direction polarized wave and the encoded signal data transmitted as the second-direction polarized wave and, based on the numbers of the bit errors, acquire polarization dependent loss information based on a polarization dependent loss incurred by the first-direction polarized wave and polarization dependent loss information based on a polarization dependent loss incurred by the second-direction polarization, as the transmission loss information, respectively.

(Supplementary Note 8)

A transmission method of encoding a received electric signal and, by a polarization-multiplexed optical signal, transmitting signal data obtained by providing encoded signal data as a result of the encoding with a predetermined error correction code, the transmission method including:

acquiring transmission loss information based on a loss that the encoded signal data acquires while being transmitted; and adjusting a redundancy of the error correction code given to the encoded signal data, based on the transmission loss information.

(Supplementary Note 9)

The transmission method according to Supplementary Note 8, including:

acquiring polarization dependent loss information based on a polarization dependent loss incurred by a first-direction polarized wave and polarization dependent loss information based on a polarization dependent loss incurred by a second-direction polarized wave, as the transmission loss information, respectively; and adjusting the redundancy of the error correction code given to the encoded signal data transmitted as the first-direction polarized wave and the redundancy of the error correction code given to the encoded signal data transmitted as the second-direction polarized wave, in accordance with the polarization dependent loss information based on the polarization dependent loss incurred by the first-direction polarized wave and the polarization dependent loss information based on the polarization dependent loss incurred by the second-direction polarized wave.

(Supplementary Note 10)

An optical transmission system including a transmission device including:

a frame encoder configured to encode an electric signal in accordance with a predetermined frame format;

an error correction encoder configured to provide encoded signal data as a result of the encoding by the frame encoder with a predetermined error correction code; and a transmission loss information acquiring part configured to acquire transmission loss information based on a loss that the encoded signal data provided with the error correction code incurs when the encoded signal data is transmitted, from a receiving device as a transmission destination, the error correction encoder being configured to adjust a redundancy of the error correction code given to the encoded signal data, based on the transmission loss information acquired by the transmission loss information acquiring part, the optical transmission system including a receiving device including:

an optical signal receiver configured to receive the encoded signal data provided with the error correction code, the encoded signal data being transmitted by the transmission device;

a transmission loss information detector configured to detect a loss that the encoded signal data incurs while being transmitted, and acquire transmission loss information based on the loss that the encoded signal data incurs while being transmitted;

a transmission loss information notifying part configured to notify the transmission loss information acquired by the transmission loss information acquiring part, to the transmission device;

a first-direction error correction decoder configured to decode encoded signal data transmitted by a first-direction polarized wave, based on the error correction code given to the encoded signal data transmitted by the first-direction polarized wave; and a second-direction error correction decoder configured to decode encoded signal data transmitted by a second-direction polarized wave, based on the error correct code given to the encoded signal data transmitted by the second-direction polarized wave.

(Supplementary Note 11)

The optical transmission system according to Supplementary Note 10, wherein:

the transmission loss information acquiring part is configured to acquire polarization dependent loss information based on a polarization dependent loss incurred by a first-direction polarized wave and polarization dependent loss information based on a polarization dependent loss incurred by a second-direction polarized wave, as the transmission loss information, respectively;

the error correction encoder is configured to adjust the redundancy of the error correction code given to the encoded signal data transmitted as the first-direction polarized wave and the redundancy of the error correction code given to the encoded signal data transmitted as the second-direction polarized wave, in accordance with the polarization dependent loss information, respectively; and the transmission loss information detector is configured to measure numbers of bit errors of the encoded signal data transmitted as the first-direction polarized wave and the encoded signal data transmitted as the second-direction polarized wave and, based on the numbers of the bit errors, acquire polarization dependent loss information based on a polarization dependent loss incurred by the first-direction polarized wave and polarization dependent loss information based on a polarization dependent loss incurred by the second-direction polarization, as the transmission loss information, respectively.

(Supplementary Note 12)

A non-transitory computer-readable medium storing a program including instructions for causing a transmission device transmitting a polarization-multiplexed optical signal to realize:

a frame encoding unit configured to encode an electric signal in accordance with a predetermined frame format;

an error correction encoding unit configured to provide encoded signal data as a result of the encoding by the frame encoding unit with a predetermined error correction code; and a transmission loss information acquiring unit configured to acquire transmission loss information based on a loss that the encoded signal data provided with the error correction code incurs when the encoded signal data is transmitted, from a receiving device as a transmission destination, the error correction encoding unit functioning to adjust a redundancy of the error correction code given to the encoded signal data, based on the transmission loss information acquired by the transmission loss information acquiring unit. (Supplementary Note 13)

The non-transitory computer-readable medium storing the program according to Supplementary Note 12, wherein:

the transmission loss information acquiring unit is configured to acquire polarization dependent loss information based on a polarization dependent loss incurred by a first-direction polarized wave and polarization dependent loss information based on a polarization dependent loss incurred by a second-direction polarized wave, as the transmission loss information, respectively; and the error correction encoding unit is configured to adjust the redundancy of the error correction code given to the encoded signal data transmitted as the first-direction polarized wave and the redundancy of the error correction code given to the encoded signal data transmitted as the second-direction polarized wave, in accordance with the polarization dependent loss information, respectively.

Although the present invention has been described above referring to the exemplary embodiments, the present invention is not limited to the exemplary embodiments. The configurations and details of the present invention can be changed and modified in various manners that can be understood by one skilled in the art within the scope of the present invention.

The invention claimed is:

1. A transmission device transmitting a polarization-multiplexed optical signal, the transmission device comprising:

a frame encoder configured to encode an electric signal in accordance with a predetermined frame format;

an error correction encoder configured to provide encoded signal data as a result of the encoding by the frame encoder with a predetermined error correction code; and a transmission loss information acquiring part configured to acquire transmission loss information based on a loss that the encoded signal data provided with the error correction code incurs when the encoded signal data is transmitted, from a receiving device as a transmission destination, wherein the error correction encoder is configured to adjust a redundancy of the error correction code given to the encoded signal data, based on the transmission loss information acquired by the transmission loss information acquiring part;

the transmission loss information acquiring part is configured to acquire polarization dependent loss information based on a polarization dependent loss incurred by a first-direction polarized wave and polarization dependent loss information based on a polarization dependent loss incurred by a second-direction polarized wave, as the transmission loss information, respectively; and the error correction encoder is configured to adjust the redundancy of the error correction code given to the encoded signal data transmitted as the first-direction polarized wave and the redundancy of the error correction code given to the encoded signal data transmitted as the second-direction polarized wave, in accordance with the polarization dependent loss information, respectively.

2. The transmission device according to claim 1, wherein the error correction encoder is configured to, in accordance with a result of comparison between the polarization dependent loss information based on the polarization dependent loss incurred by the first-direction polarized wave and the polarization dependent loss information based on the polarization dependent loss incurred by the second-direction polarized wave, adjust the redundancy of the error correction code given to the encoded signal data transmitted as a polarization wave of a direction in which the polarization dependent loss is larger, so as to be longer than the redundancy of the error correction code given to the encoded signal data transmitted as a polarized wave of the other direction.

3. The transmission device according to claim 2, wherein the error correction encoder is configured to, in accordance with a result of comparison between the polarization dependent loss information based on the polarization dependent loss incurred by the first-direction polarized wave and the polarization dependent loss information based on the polarization dependent loss incurred by the second-direction polarized wave, adjust the redundancy of the error correction code given to the encoded signal data transmitted as a polarization wave of a direction in which the polarization dependent loss is smaller, so as to be shorter than the redundancy of the error correction code given to the encoded signal data transmitted as a polarized wave of the other direction.

4. The transmission device according to claim 2, wherein the frame encoder is configured to, when the error correction encoder provides the encoded signal data transmitted as the first-direction polarized wave and the encoded signal data transmitted as the second-direction polarized wave with error correction codes of different redundancies, adjust a bit length of the encoded signal data transmitted as the first-direction polarized wave and a bit length of the encoded signal data transmitted as the second-direction polarized wave, in accordance with the redundancies of the respective error correction codes given by the error correction encoder.

5. A receiving device comprising:

an optical signal receiver configured to receive a polarization-multiplexed optical signal obtained by multiplexing a first-direction polarized wave and a second-direction polarized wave, each of which is obtained by modulating signal data composed of encoded signal data and an error correction signal;

a transmission loss information detector configured to detect a loss that the encoded signal data incurs while being transmitted, and acquire transmission loss information based on the loss that the encoded signal data incurs while being transmitted;

a transmission loss information notifying part configured to notify the transmission loss information acquired by the transmission loss information detector, to a transmission device;

a first-direction error correction decoder configured to decode encoded signal data transmitted by the first-direction polarized wave, based on the error correction code given to the encoded signal data transmitted by the first-direction polarized wave; and a second-direction error correction decoder configured to decode encoded signal data transmitted by the second-direction polarized wave, based on the error correction code given to the encoded signal data transmitted by the second-direction polarized wave.

6. The receiving device according to claim 5, wherein the transmission loss information detector is configured to measure numbers of bit errors of the encoded signal data transmitted as the first-direction polarized wave and the encoded signal data transmitted as the second-direction polarized wave and, based on the numbers of the bit errors, acquire polarization dependent loss information based on a polarization dependent loss incurred by the first-direction polarized wave and polarization dependent loss information based on a polarization dependent loss incurred by the second-direction polarization, as the transmission loss information, respectively.

7. A transmission method of encoding a received electric signal and, by a polarization-multiplexed optical signal, transmitting signal data obtained by providing encoded signal data as a result of the encoding with a predetermined error correction code, the transmission method comprising:

acquiring transmission loss information based on a loss that the encoded signal data acquires while being transmitted;

adjusting a redundancy of the error correction code given to the encoded signal data, based on the transmission loss information;

acquiring polarization dependent loss information based on a polarization dependent loss incurred by a first-direction polarized wave and polarization dependent loss information based on a polarization dependent loss incurred by a second-direction polarized wave, as the transmission loss information, respectively; and adjusting the redundancy of the error correction code given to the encoded signal data transmitted as the first-direction polarized wave and the redundancy of the error correction code given to the encoded signal data transmitted as the second-direction polarized wave, in accordance with the polarization dependent loss information, respectively.

8. An optical transmission system comprising a transmission device including:

a frame encoder configured to encode an electric signal in accordance with a predetermined frame format;

an error correction encoder configured to provide encoded signal data as a result of the encoding by the frame encoder with a predetermined error correction code; and a transmission loss information acquiring part configured to acquire transmission loss information based on a loss that the encoded signal data provided with the error correction code incurs when the encoded signal data is transmitted, from a receiving device as a transmission destination, the error correction encoder being configured to adjust a redundancy of the error correction code given to the encoded signal data, based on the transmission loss information acquired by the transmission loss information acquiring part, the optical transmission system comprising a receiving device including:

an optical signal receiver configured to receive the encoded signal data provided with the error correction code, the encoded signal data being transmitted by the transmission device;

a transmission loss information detector configured to detect a loss that the encoded signal data incurs while being transmitted, and acquire transmission loss information based on the loss that the encoded signal data incurs while being transmitted;

a transmission loss information notifying part configured to notify the transmission loss information acquired by the transmission loss information acquiring part, to the transmission device;

a first-direction error correction decoder configured to decode encoded signal data transmitted by a first-direction polarized wave, based on the error correction code given to the encoded signal data transmitted by the first-direction polarized wave; and a second-direction error correction decoder configured to decode encoded signal data transmitted by a second-direction polarized wave, based on the error correct code given to the encoded signal data transmitted by the second-direction polarized wave.

9. A non-transitory computer-readable medium storing a program comprising instructions for causing a transmission device transmitting a polarization-multiplexed optical signal to realize:

a frame encoding unit configured to encode an electric signal in accordance with a predetermined frame format;

an error correction encoding unit configured to provide encoded signal data as a result of the encoding by the frame encoding unit with a predetermined error correction code; and a transmission loss information acquiring unit configured to acquire transmission loss information based on a loss that the encoded signal data provided with the error correction code incurs when the encoded signal data is transmitted, from a receiving device as a transmission destination, the error correction encoding unit functioning to adjust a redundancy of the error correction code given to the encoded signal data, based on the transmission loss information acquired by the transmission loss information acquiring unit;

the transmission loss information acquiring part is configured to acquire polarization dependent loss information based on a polarization dependent loss incurred by a first-direction polarized wave and polarization dependent loss information based on a polarization dependent loss incurred by a second-direction polarized wave, as the transmission loss information, respectively; and the error correction encoder is configured to adjust the redundancy of the error correction code given to the encoded signal data transmitted as the first-direction polarized wave and the redundancy of the error correction code given to the encoded signal data transmitted as the second-direction polarized wave, in accordance with the polarization dependent loss information, respectively.

* * * * *